(12) United States Patent
Xie et al.

(10) Patent No.: US 7,459,731 B2
(45) Date of Patent: Dec. 2, 2008

(54) DEVICE CONTAINING ISOLATION REGIONS WITH THREADING DISLOCATIONS

(75) Inventors: Ya-Hong Xie, Beverly Hills, CA (US); Tae-Sik Yoon, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 129 days.

(21) Appl. No.: 11/468,716

(22) Filed: Aug. 30, 2006

(65) Prior Publication Data
US 2007/0018285 A1    Jan. 25, 2007

Related U.S. Application Data

(62) Division of application No. 11/187,444, filed on Jul. 22, 2005, now Pat. No. 7,186,626.

(51) Int. Cl.
H01L 23/58 (2006.01)
(52) U.S. Cl. .............. 257/190; 257/297; 257/305; 257/299; 257/E21.01; 438/703; 438/172
(58) Field of Classification Search ............. 438/703, 438/172; 257/296
See application file for complete search history.

(56) References Cited

U.S. PATENT DOCUMENTS

| | | | | |
|---|---|---|---|---|
| 6,121,651 A | * | 9/2000 | Furukawa et al. | 257/296 |
| 6,184,144 B1 | * | 2/2001 | Lo | 438/703 |
| 6,576,558 B1 | | 6/2003 | Lin et al. | |
| 6,872,641 B1 | | 3/2005 | Chidambarro et al. | |
| 6,902,965 B2 | * | 6/2005 | Ge et al. | 438/172 |

FOREIGN PATENT DOCUMENTS

GB    2418531 A    3/2006

JP    2004-111638    4/2004
JP    2004-111638 A    4/2004

OTHER PUBLICATIONS

Fitzerald et al., Elimination of Dislocations in Heteroexitaxial MBE and RTCVD Gex-Si1-x Grown on Patterned Si Substrates, J. Electronic Materials, 19, 949-954 (1990).
Watson et al., Influence of Misfit Dislocation Interactions on Photoluminescene Spectra of SiGe on Patterned Si, J. Appl. Phys., vol. 83:7, Apr. 1998.
Kim et al., Three Stage Nucleation and Growth of GE Self-Assembled Quantum Dots Grown on Partially Relaxe SiGe Buffer Layers, Phys. Rev. B vol. 68, No. 20, 205312 (2003).
PCT International Search Report for PCT/US2005/26364, Applicant: The Regents of University of California, Form PCT/ISA/210 and 220, dated Oct. 18, 2007 (6 pages).
PCT Written Opinion of the International Search Authority for PCT/US2005/26364, Applicant: The Regents of University of California, Form PCT/ISA/237, dated Oct. 18, 2007 (7 pages).
The International Bureau International Preliminary Report on Patentability for PCT/US2005/26364, Applicant: The Regents of University of California, Form PCT/IB/326, Jan. 31, 2008 (8 pages).

* cited by examiner

*Primary Examiner*—Evan Pert
*Assistant Examiner*—Scott R Wilson
(74) *Attorney, Agent, or Firm*—Vista IP Law Group LLP

(57) ABSTRACT

An article of manufacture includes a substrate, a relaxed buffer layer disposed on the substrate, and a plurality of isolation regions formed in the relaxed buffer layer. The isolation regions include threading dislocations while the remainder of the relaxed buffer layer is substantially free of threading dislocations. The relaxed buffer layer may be formed from silicon germanium while the substrate may be formed from silicon. A capping layer may be disposed over the relaxed buffer layer.

19 Claims, 27 Drawing Sheets

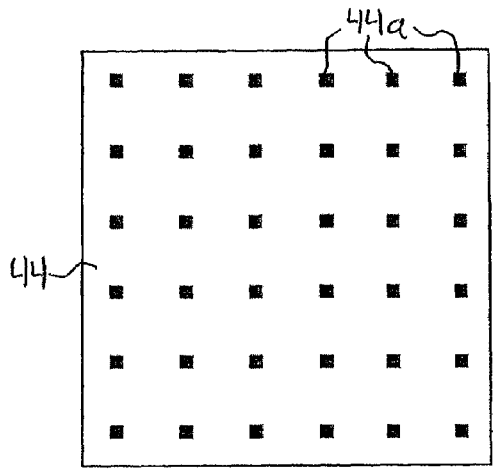
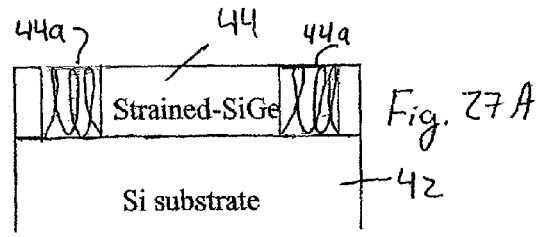
Fig. 27A
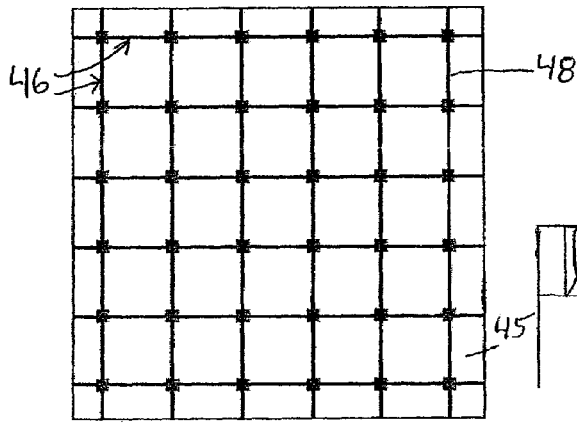
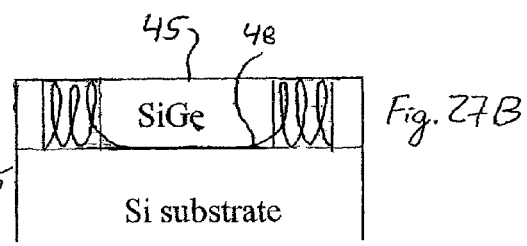
Fig. 27B
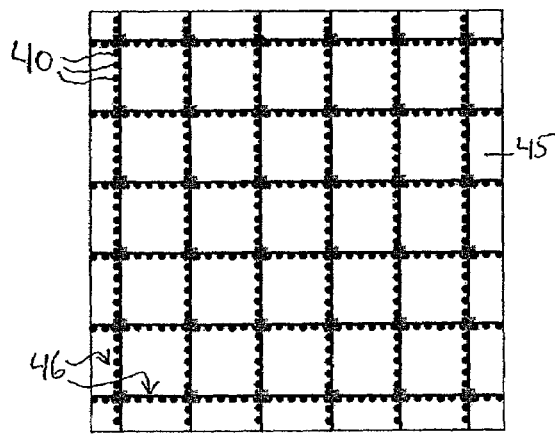
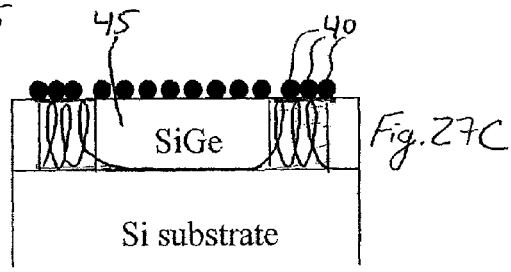
Fig. 27C

DEVICE CONTAINING ISOLATION REGIONS WITH THREADING DISLOCATIONS

REFERENCE TO RELATED APPLICATIONS

This Application is a divisional of and claims priority to U.S. patent application Ser. No. 11/187,444 filed on Jul. 22, 2005 entitled METHOD FOR CONTROLLING DISLOCATION POSITIONS IN SILICON GERMANIUM BUFFER LAYERS. Priority is claimed under 35 U.S.C. §§ 102 and 121. U.S. patent application Ser. No. 11/187,444 is incorporated by reference as if set forth fully herein.

TECHNICAL FIELD

The disclosure generally relates methods for controlling dislocation positions in buffer layers, such as for semiconductors, such as silicon or silicon germanium buffer layers. The disclosure further relates to methods for reducing threading dislocation density in substrates formed from semiconductors, such as for silicon-based or silicon germanium-based devices.

BACKGROUND

Semiconductor materials, such as silicon germanium (SiGe) and strained silicon (Si) based devices, for example, have increasingly gained attention as candidates for next generation semiconductor devices. SiGe and Si based devices are of interest in addressing issues associated with current semiconductor devices which use a silicon channel layer disposed on a silicon substrate, for example. SiGe and Si based channel devices have the potential to be used in high speed devices with potentially higher carrier mobility than current silicon channel devices.

SiGe channels typically are difficult to grow on silicon substrates because of the large lattice constant mismatch between silicon and germanium. Consequently, current methods employ a quality relaxed silicon germanium intermediate layer or "virtual substrate" to provide a lattice constant that is larger than the underlying silicon substrate (e.g., substrate). For example, a thin Si epitaxial layer under tensile strain may be grown on top of the "virtual substrate" to be used as the MOSFET channel.

In current applications, for example, a silicon germanium buffer layer may be grown on a silicon substrate by heteroepitaxy through molecular beam epitaxy or chemical vapor deposition (CVD). The growth condition may be such that the silicon germanium buffer layer is in a state of near complete strain relaxation throughout the growth process leading to a larger in-plane lattice constant on its surface than the silicon substrate. The increased lattice constant may be the result of "misfit dislocations" formed in the relaxed silicon germanium layer. At typical temperatures of epitaxial growth and relaxation, such dislocations may comprise 60-degree type dislocations that move in (111) planes, for example.

Generally, during the relaxation process, only the misfit segments of the dislocation half-loops contribute to the relaxing of the in-plane strain. Consequently, the misfit segments (as opposed, for example, to threading dislocations) are typically desirable for relaxed buffer layers. The threading arms associated with each dislocation half-loop are, however, undesirable. The goal of relaxed SiGe buffer layer fabrication methods is to thus maximize ratio of misfit to threading dislocation density. Moreover, a flat surface is desirable to reduce interface scattering associated with undulation of the substrate interface.

Use of graded silicon germanium buffer layers has been investigated as one potential approach to obtain a quality silicon germanium virtual substrate. Generally, this involves a SiGe buffer layer with a continuously graded amount of Ge in the SiGe buffer layer. In the case of a SiGe layer with a constant composition (i.e., not graded) grown on a silicon substrate, for example, dislocations may nucleate during growth and interact with one another. This interaction inhibits dislocations from propagating to the substrate edge and may leave a large number of threading arms on the surface of the SiGe layer.

In contrast, if a graded Ge composition is used, during relaxation of the SiGe layer on the silicon substrate, the nucleation of dislocations across the surface may be mitigated by reducing the strain accumulation rate. Consequently, the interaction between dislocations may be reduced and the density of threading arm dislocations on the surface of the SiGe layer may be reduced. For instance, for a constant SiGe layer grown directly on a silicon substrate, the density of threading dislocations may be around $10^{8\sim9}/cm^2$. In contrast, the density of threading dislocations in a graded SiGe layer grown on a silicon substrate may be around $10^{4\sim5}/cm^2$. While graded SiGe reduces the threading dislocation density, the Ge grading rate may be low, typically at or less than 10%/μm. Consequently, this requires a large thickness of graded SiGe buffer layer, which is a drawback because of, among other reasons, the increased production costs and increased thermal resistance. The thick graded SiGe buffer layer thus reduces the number of practical applications in which SiGe based devices can be used. Moreover, the strain-relaxed graded SiGe buffer layer generally has a rough surface.

One approach to reducing the threading dislocation density includes employing a low temperature silicon buffer layer prior to growing a silicon germanium layer. In addition, ion implantation after growing a strained SiGe layer and subsequent annealing has been investigated as a potential solution to reducing threading dislocation density. Generally, these methods function by introducing non-equilibrium point defects in the layers through a low temperature silicon buffer layer or through ion implantation and then inducing the clustering of point defects to relax the strain. This results in a low density of threading dislocations. These approaches have shown reduced threading density values of less than $10^4/cm^2$.

The above-identified proposed solutions have demonstrated SiGe buffer layers with reduced threading dislocation density compared to the constant composition SiGe layer directly grown on silicon substrate. However, the density of threading dislocation is still higher than about $1/cm^2$ if the buffer layer is grown on a silicon substrate. Moreover, threading dislocations may be randomly distributed across the entire substrate. This random distribution of threading dislocations may result in deviation of the properties of individual devices formed on the substrate. In other words, threading dislocations degrade some devices formed on the surface of the substrate while others are not.

Ideally, a relaxed SiGe buffer layer has no threading dislocations on the entire or a significant portion of the surface. However, from a device fabrication point of view, it is not necessary for the entire surface of the substrate to be free of threading dislocations. For example, in current semiconductor designs, individual devices may be fabricated on a substrate and are separated by non-functional field oxide or trench isolation regions. These regions may be employed to separate adjacent devices. Thus, it may be possible to achieve suitable conditions by removing the threading dislocations from the areas of the surface in which or on which devices are to be built. Consequently, it is desirable to form a relaxed SiGe layer without threading dislocations at position-controlled regions where the devices are built.

Attempts have been made to control the location of dislocation distribution by forming patterned silicon mesa structures with and without Ge implantation. For example, Fitzgerald et al., *Elimination of Dislocations in Heteroepitaxial MBE and RTCVD $Ge_xSi_{1-x}$ Grown on Patterned Si Substrates*, J. Electronic Materials, 19, 949 (1990) describes a process of fabricating a patterned silicon mesa structure and then growing a SiGe layer thereon. The patterned mesa structure reduces the threading dislocation density by limiting the dislocation interaction at small growth areas and then allowing the threading segments to escape at the mesa edge.

In Watson et al., *Influence of Misfit Dislocation Interactions on Photoluminescence Spectra of SiGe on patterned Si*, J. Appl. Phys. 83, 3773 (1998), discloses a process of controlling dislocation nucleation during SiGe layer growth on Ge implanted Si regions that were previously patterned before implantation. However, the use of mesa structures raises complications because the non-planar mesa structure is fundamentally incompatible with planar silicon VLSI technology.

SUMMARY

A method is disclosed for forming dislocations in selected areas or regions of a planar strained silicon germanium layer grown on a silicon substrate. The method may also be used for forming dislocations in selected areas or regions of a planar silicon substrate. In one aspect of the method, dislocations may be formed by intentionally damaging selected regions through ion implantation, ion beam illumination, or other energetic beam illumination.

The damaged regions may contain a plurality of dislocation half-loops or full loops. After an annealing process, the dislocations relax the strain of the silicon germanium layer by permitting the misfit segments to propagate from one damaged region to another. In the damaged region, the dislocation density may be extremely high leading to extensive dislocation-dislocation interaction. The dislocation half-loops with the correct Burger's vectors at the outskirts of the damaged regions may be free to move out into the strained film upon annealing. The net result is that the damaged regions may act as sources as well as barriers/sinks for dislocation half-loops.

In one embodiment, the method may form dislocations and in particular, threading dislocations, in the damaged or ion implanted regions of a substrate or overlying SiGe layer. In one aspect the locations of the threading dislocations may be lithographically defined.

While the method may produce substrates having average threading density values greater than conventional relaxed buffer layers (as measured across the entire substrate surface), the density may be concentrated in one or more regions that are not used to create active electronic devices. The threading dislocation density in these "pristine" or undamaged regions may be as low as the starting silicon wafers. The damaged regions where dislocations may be preferentially formed may be used for trench isolation regions or field oxide regions, thereby reducing any potential to waste areas of the substrate.

The overall fraction of the damaged regions using this method may be estimated as follows. The width of the damaged region may be defined using conventional lithographic techniques to be as narrow as 0.1 μm. A separation between the damaged regions may be dictated by an average misfit dislocation lengths, which may be on the order of 50 μm or larger. As a result, the fractional area occupied by the damaged regions may be less than 1%.

In one aspect of the process, threading arms may be located at one or more "damaged" regions, leaving the remainder of the substrate (or overlying layer) with substantially no threading dislocations. The damaged regions may occupy a small fraction of the overall surface area of the substrate. The damaged regions may be formed into field oxides or trenches for isolation between devices, thereby avoiding waste of the surface area of the substrate.

In another embodiment, a thin silicon layer may be grown over the silicon germanium layer as a nucleation-inhibiting layer. The silicon "capping" layer may prevent nucleation of dislocation loops at a free surface of the SiGe layer. The process may also be optimized with respect to other parameters such as growth temperature, thickness, Ge composition of the SiGe layer, and annealing conditions to prevent unwanted nucleation of dislocations in the non-damaged regions of the substrate.

In another embodiment, a method for controlling the dislocation position in a silicon germanium buffer layer includes providing a substrate and depositing a strained silicon germanium layer on the substrate. The silicon germanium layer may then be irradiated at one or more regions with a dislocation inducing agent. The dislocation inducing agent may include an ion beam, electron beam, other source of radiation. The substrate and the strained silicon germanium layer may then be subject to an annealing process to transform the strained silicon germanium layer from a coherently strained state, i.e., a dislocation-free state, into a relaxed state with dislocations. Dislocations in the silicon germanium layer are preferentially located in the one or more regions. For example, the one or more regions may contain a high concentration of threading dislocations while the remaining regions of the substrate are substantially free of threading dislocations.

In another embodiment, a method for controlling the dislocation position in a silicon germanium buffer layer includes providing a substrate and irradiating one or more regions of the substrate with a dislocation inducing agent. Strained silicon germanium is then deposited on the substrate. The substrate and the strained silicon germanium layer may then be subjected to an annealing process to transform the strained silicon germanium layer into a relaxed state. According to the process, dislocations in the silicon germanium layer may be located in the one or more regions.

In still another embodiment, a method of forming an array of quantum dots on a substrate includes providing a substrate and depositing a strained silicon germanium layer on the substrate. One or more regions of the silicon germanium layer may be irradiated with a dislocation inducing agent. The substrate and the strained silicon germanium layer may then be subjected to an annealing process to transform the strained silicon germanium layer into a relaxed state, wherein the relaxation in the silicon germanium layer forms a dislocation network in the relaxed silicon germanium layer. Quantum dots are then formed on the dislocation network.

In yet another embodiment, a device or article of manufacture includes a substrate, a relaxed buffer layer disposed on the substrate, and a plurality of isolation regions formed in the relaxed buffer layer. The isolation regions include threading dislocations while the remainder of the relaxed buffer layer is substantially free of threading dislocations. The relaxed buffer layer may be formed from silicon germanium while the substrate may be formed from silicon.

In still another embodiment, a device or article of manufacture includes a substrate, a relaxed buffer layer disposed on the substrate, an array of damaged regions formed in the relaxed buffer layer, and an intersecting dislocation network including misfit dislocation segments that interconnect with the array of damaged regions. A plurality of quantum dots may be formed on the intersecting dislocation network.

In another embodiment of the invention, a device or article of manufacture includes a substrate, a relaxed buffer layer disposed on the substrate, and an intersecting dislocation network formed in the relaxed buffer layer including misfit dislocation segments intersecting generally perpendicular to one another. A plurality of quantum dots may be formed on the intersecting dislocation network.

It is thus one object to provide a method for controlling the dislocation position in a silicon germanium buffer layer. It is another object to damage selected regions of a silicon germanium layer such that threading dislocations are isolated in the damaged regions. It is a further object to transform the damaged regions containing the threading dislocations into field oxide regions and/or isolation trenches. Further features and advantages will become apparent upon review of the following drawings and description of the disclosed embodiments.

BRIEF DESCRIPTION OF THE DRAWINGS

FIG. 14 further illustrates a mask located on the upper surface of the top layer.

FIG. 24 illustrates the misfit dislocation segments propagating to adjacent damaged regions.

FIG. 27A illustrates top and side views of a silicon substrate having an overlying layer of strained silicon germanium. An array of damaged regions is patterned in the strained silicon layer. Dislocations may be formed in the damaged regions.

FIG. 27B illustrates top and side views the silicon substrate and overlying layer of FIG. 27A. The silicon germanium layer is in a relaxed state (e.g., from an annealing process). The strain relaxation causes the formation of a network of misfit dislocation segments.

FIG. 27C illustrates top and side views of the silicon substrate and overlying layer of FIG. 27B. A plurality of quantum dots are formed on the dislocation network to generate a regular array of quantum dots.

DETAILED DESCRIPTION

Figure 1:
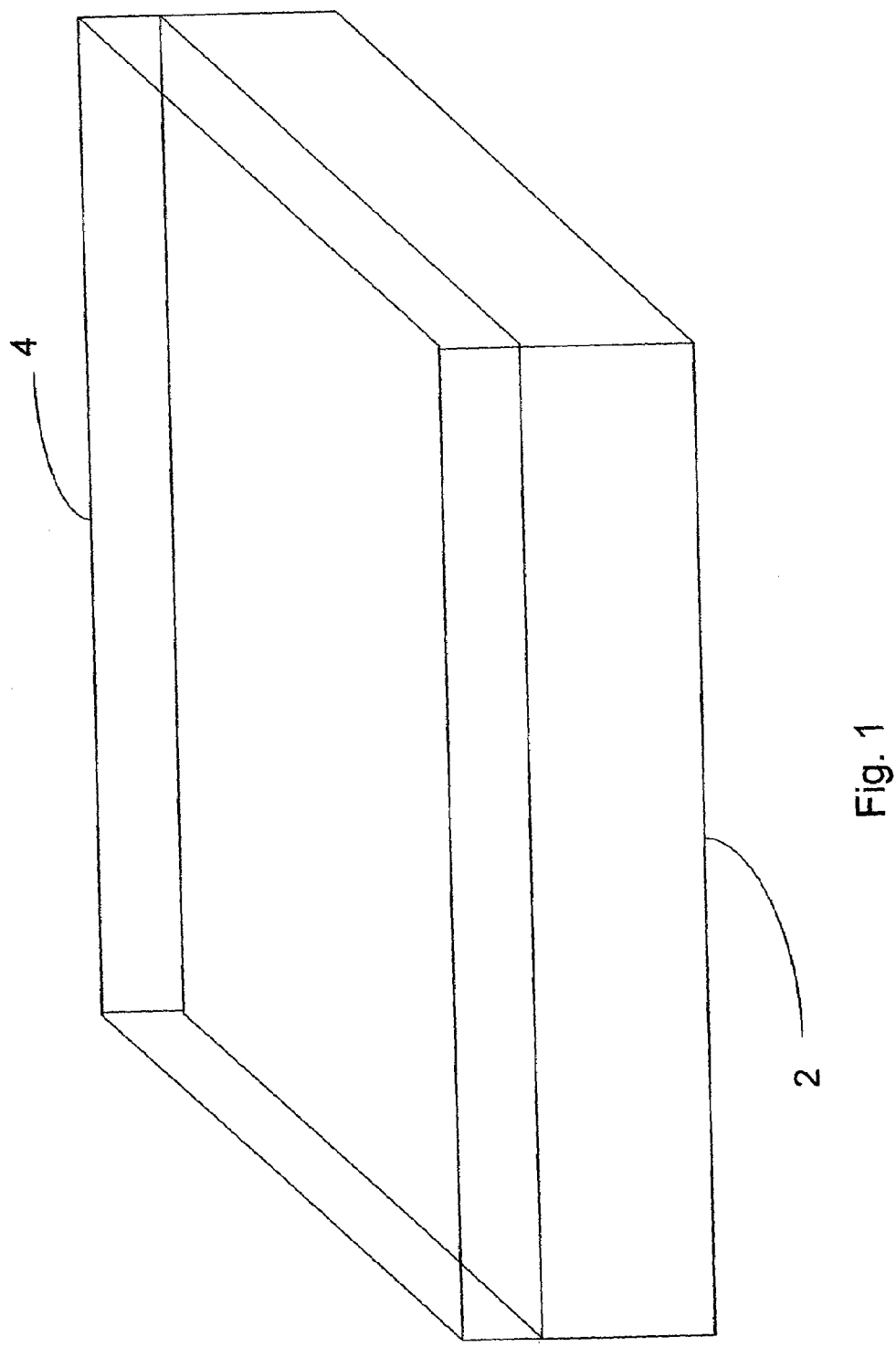
FIG. 1 illustrates a perspective view of a substrate having a strained silicon germanium layer thereon.
Figure 2:
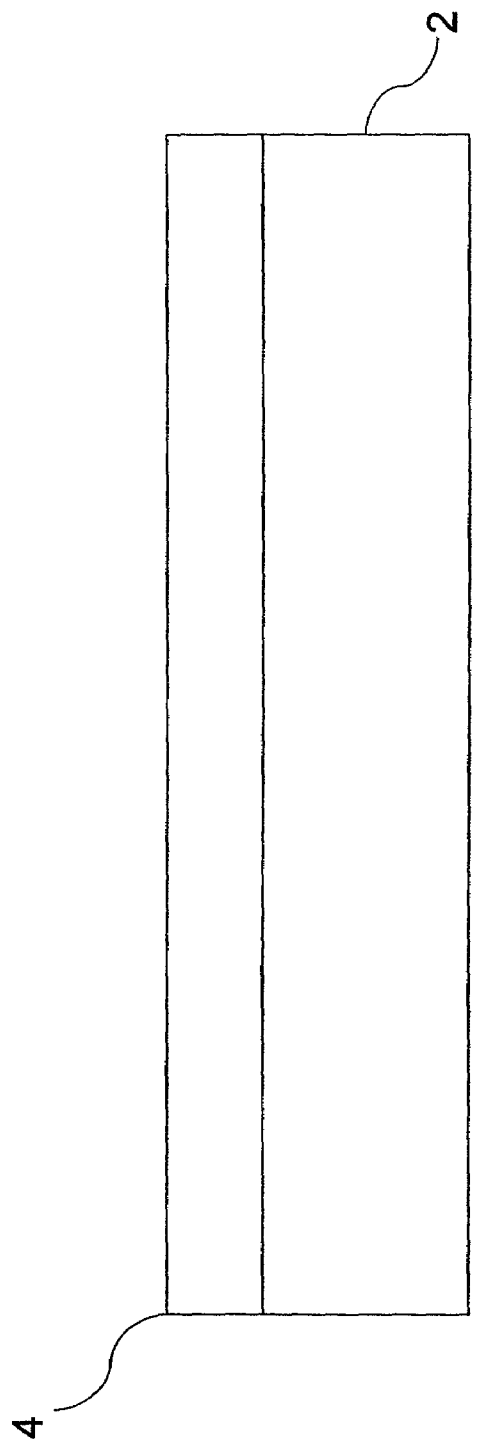
FIG. 2 illustrates a side view of the substrate and strained silicon germanium layer shown in FIG. 1.

With reference now to FIGS. 1 through 19, an embodiment of a process is disclosed for controlling the dislocation position in a buffer layer formed, for example, from silicon germanium ($Si_xGe_{1-x}$). Of course, the buffer layer may be formed from materials other than silicon germanium. FIGS. 1 and 2 illustrates a substrate 2 having a layer 4 of strained silicon germanium disposed thereon. The substrate 2 may be formed from, for example, silicon or some other semiconductor material. In addition, the substrate 2 may take the form of a wafer or the like. The layer 4 of strained silicon germanium may be formed through manufacturing processes such as, for instance, molecular beam epitaxy and/or chemical vapor deposition, although the claimed subject matter is not limited in scope to these particular processes. The layer 4 of strained silicon germanium may be formed with no dislocations formed therein. In addition, the layer 4 of strained silicon germanium may have a substantially flat upper surface. The layer 4 of strained silicon germanium may be grown either in a metastable state or an equilibrium state at growth temperatures, for example.

Figure 3:
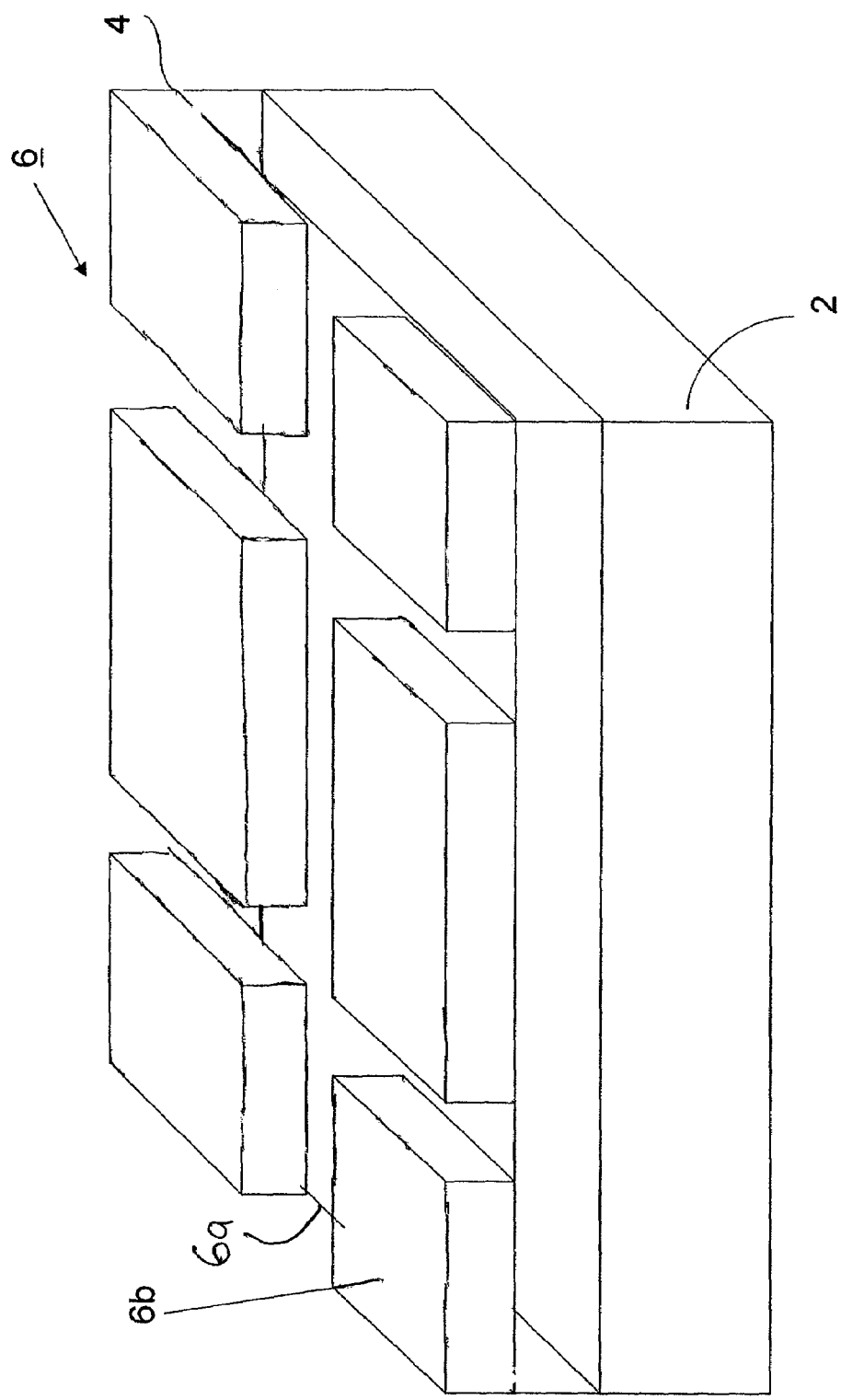
FIG. 3 illustrates a perspective view of the substrate and strained silicon germanium layer with a mask located on an upper surface of the strained silicon germanium layer.
Figure 4:
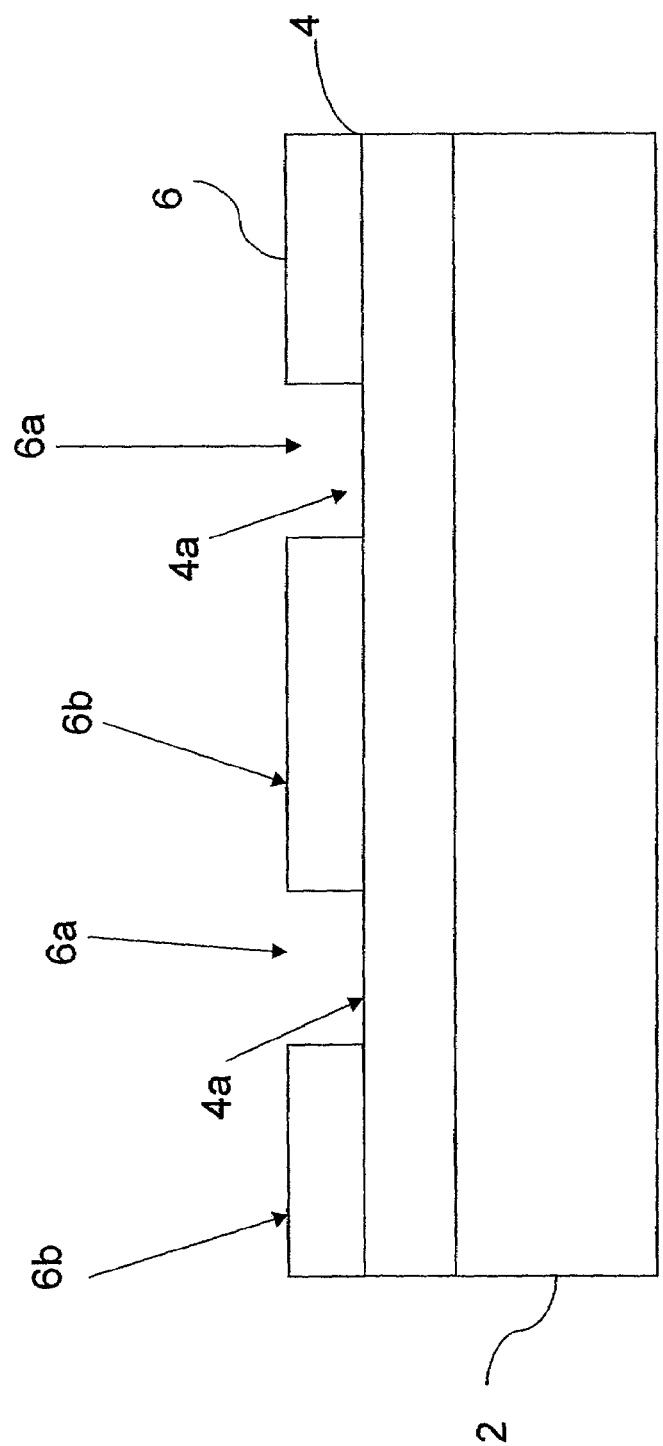
FIG. 4 illustrates a side view of the substrate and strained silicon germanium layer having a mask composed of photoresist, dielectric material, or other material disposed on the silicon germanium layer.

FIGS. 3 and 4 illustrate a mask 6 disposed on the strained layer 4 of silicon germanium. The mask 6 is used to define pre-defined regions (described in more detail below) that are damaged in a subsequent irradiation step. Any conventional or later-developed lithographic technique may be employed to form the pre-defined regions. Example lithographic techniques include photolithography, electron beam lithography, ion beam lithography, nano-imprint methods, and soft-lithography processes. FIGS. 3 and 4 illustrates a mask 6 disposed on or over the layer 4 of strained silicon germanium. The mask 6 may be formed from, for example, a photoresist, dielectric, or other suitable material.

In an alternative process, the mask 6 may disposed away from the surface of the strained layer 4 of silicon germanium. For example, the mask 6 may be formed from a stencil mask 6.

As seen in FIGS. 3 and 4, the mask 6 includes open regions 6a and blocked regions 6b. The open regions 6a expose at least a portion of the layer 4 of strained silicon germanium layer for subsequent irradiation, as described, for example, in detail below.

Figure 5:
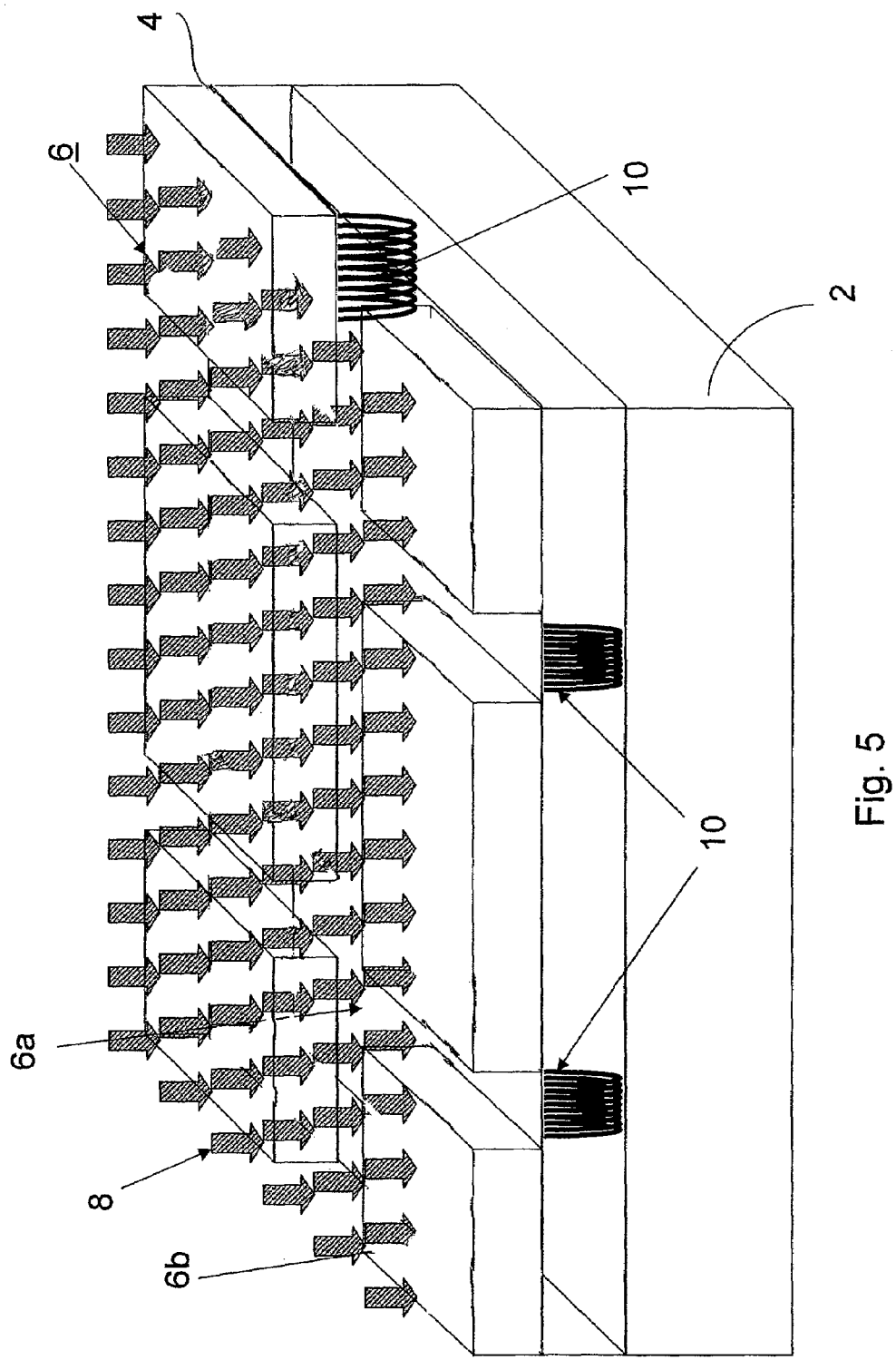
FIG. 5 illustrates a perspective view of the substrate and strained silicon germanium layer being irradiated with a dislocation inducing agent (e.g., Ge+ ions). Dislocations are created in one or more regions of the strained silicon germanium layer by use of the mask.
Figure 6:
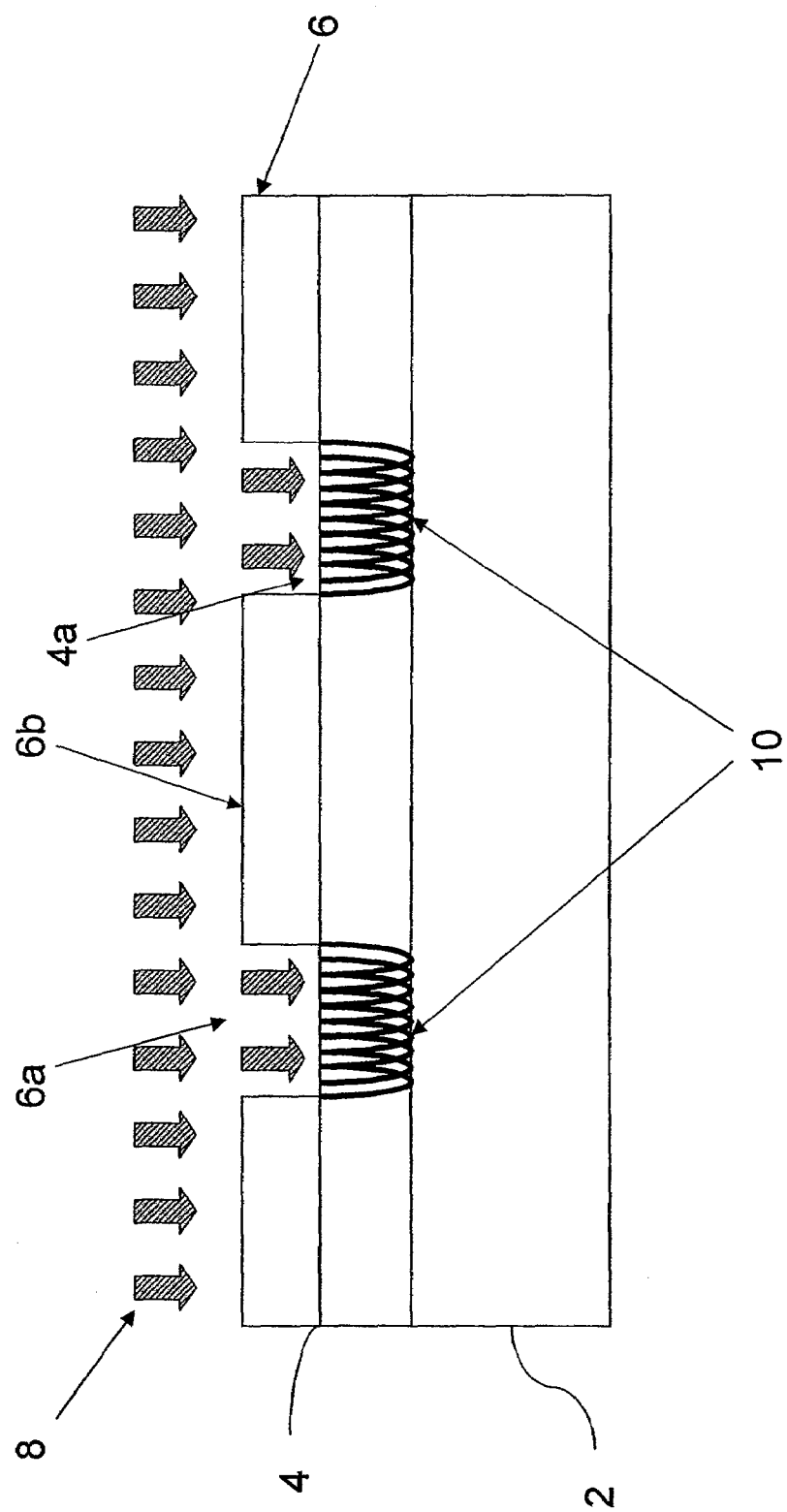
FIG. 6 illustrates a side view of the process illustrated in FIG. 5.

FIGS. 5 and 6 illustrate a process of irradiating one or more regions 4a of the layer 4 of strained silicon germanium layer with a dislocation inducing agent 8. The one or more regions 4a may be those regions of the layer 4 of strained silicon germanium that are exposed through the open regions 6a of the mask 6. The process of irradiating the one or more regions 4a damages those regions 4a to form dislocations 10. The dislocations 10 are thus preferentially formed in the one or more regions 4a of the layer 4 of silicon germanium in this particular embodiment. The dislocations 10 may include dislocation loops.

The dislocation inducing agent 8 may include an ion beam, electron beam, or other energetic radiation source (e.g., electron beam or x-ray) capable of forming dislocations in the silicon germanium layer 4. Generally, the dislocation inducing agent 8 should be capable of disordering the lattice of the exposed surface or substrate 2. For example, the dislocation inducing agent 8 may include a germanium ion beam (Ge+ ions). Other examples of ions capable of inducing dislocations include silicon ions, oxygen ions, hydrogen ions, helium ions, neon ions, nitrogen ions, carbon ions, and argon ions. Traditional dopant elements such as boron, phosphorous, arsenic, and antimony, may also be used (in either ionic or neutral form). Thus, the dislocation inducing agent 8 may include neutral or non-ionic species, for example. The regions 4a (e.g., damaged regions) of the layer 4 of silicon germanium contain numerous dislocation loops caused by the impinging dislocation inducing agent 8.

The dislocation loops in (111) planes with <110> directions within the dislocations 10 (as shown, for example, in FIG. 5) propagate and contribute to strain relaxation at a subsequent relaxation operation. The nature and/or properties of the regions 4a (as shown in FIG. 4) may be affected at least in part via the stress level of the silicon germanium layer 4, the geometry of the silicon germanium layer 4, as well as the structures and/or functionalities of the devices intended to be built or fabricated. The damaged region may be generally deep within the silicon germanium layer 4, at, for example, the interface between the substrate 2 and the layer 4 of silicon germanium (as is shown in FIGS. 5 and 6), or even inside the substrate 2, for example.

FIGS. 5 and 6 illustrate the regions 4a in the shape of lanes across the surface of the silicon germanium layer 4. The regions 4a may include a plurality of lanes arranged in an intersecting orientation (as is shown in FIG. 5). Generally, the width of the regions 4a (e.g., lanes) may be larger than the critical radius of the dislocation loops formed therein. The critical radius is defined as the radius at which formation of dislocation half loops becomes energetically favorable.

The dislocation loops may have a critical radius within the range of about 10 nm to about 50 nm. Consequently, the width of the regions 4a may be greater than about 10 nm and greater than 50 nm, for example, in one particular embodiment. Of course, the claimed subject matter is not limited in scope in this respect.

Figure 7:
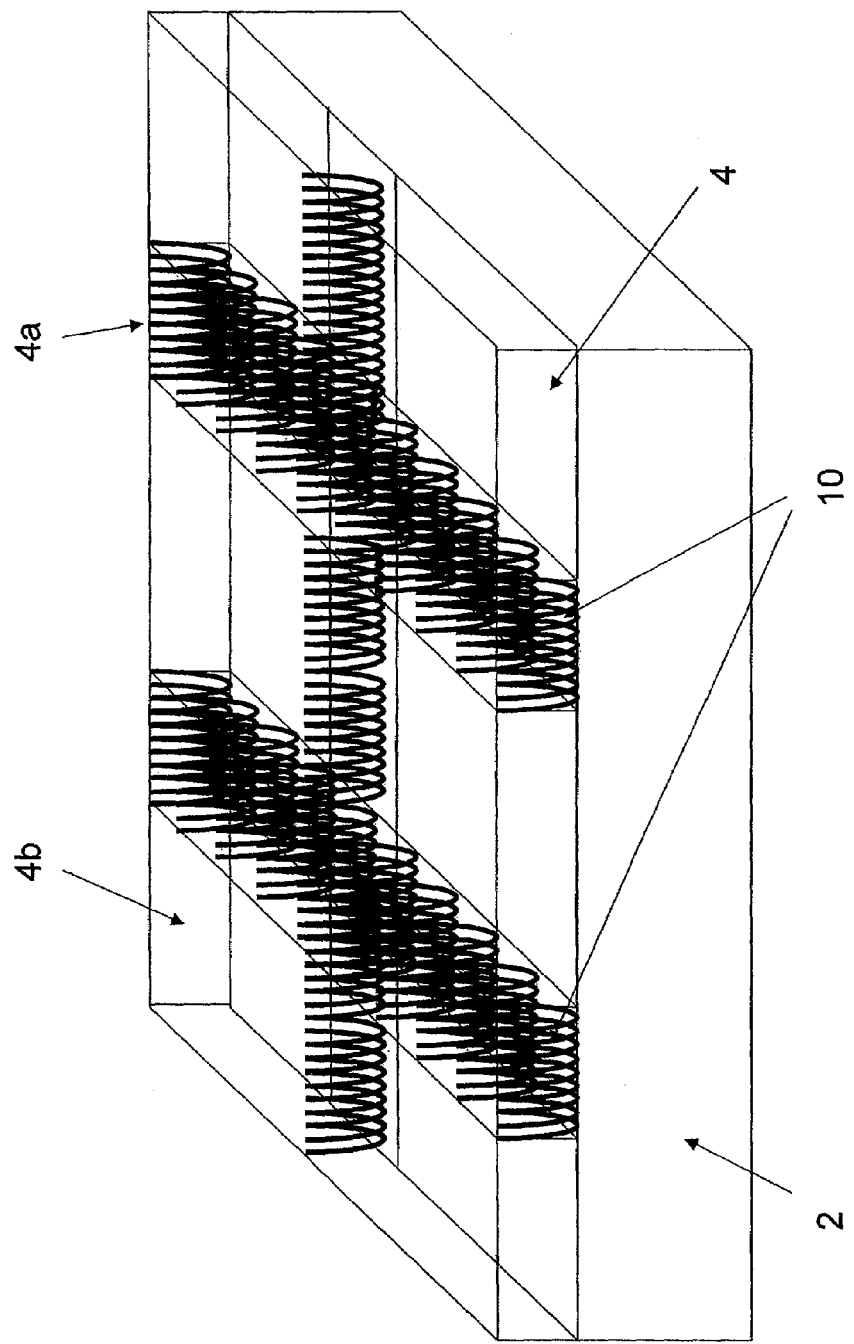
FIG. 7 illustrates a perspective view of the substrate and strained silicon germanium layer with the mask removed. The damaged regions contain dislocation loops.
Figure 8:
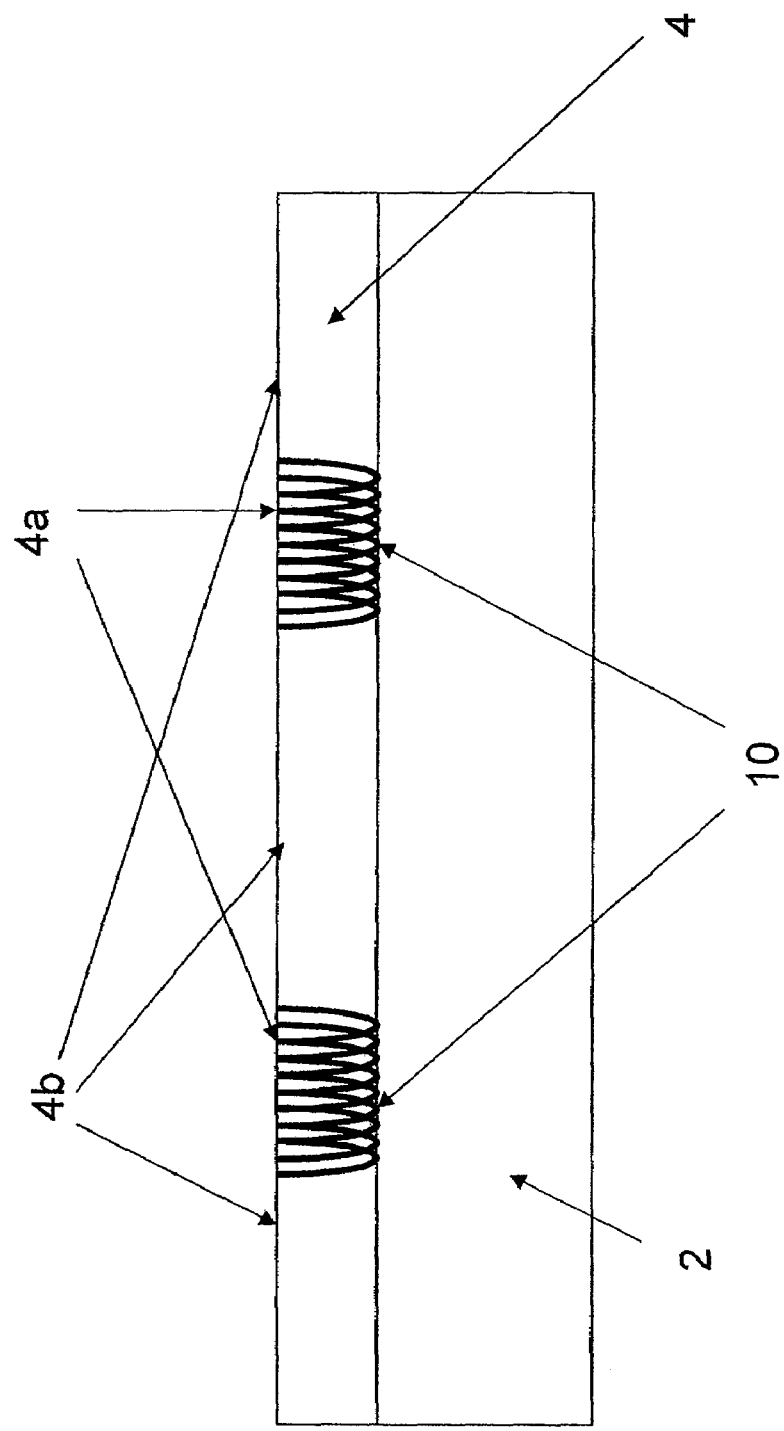
FIG. 8 is a side view of the substrate and strained silicon germanium layer shown in FIG. 7.

FIGS. 7 and 8 illustrate the mask 6 removed from above the surface of the silicon germanium layer 4. The mask 6 may be removed prior to relaxing the strained silicon germanium layer 4. In an alternative embodiment, the mask 6 may be removed after relaxing the strained silicon germanium layer 4. As seen in FIGS. 7 and 8, the dislocations 10 are contained in the regions 4a leaving other regions such as the regions 4b (e.g., non-damaged regions), having little or nearly no dislocations.

Figure 9:
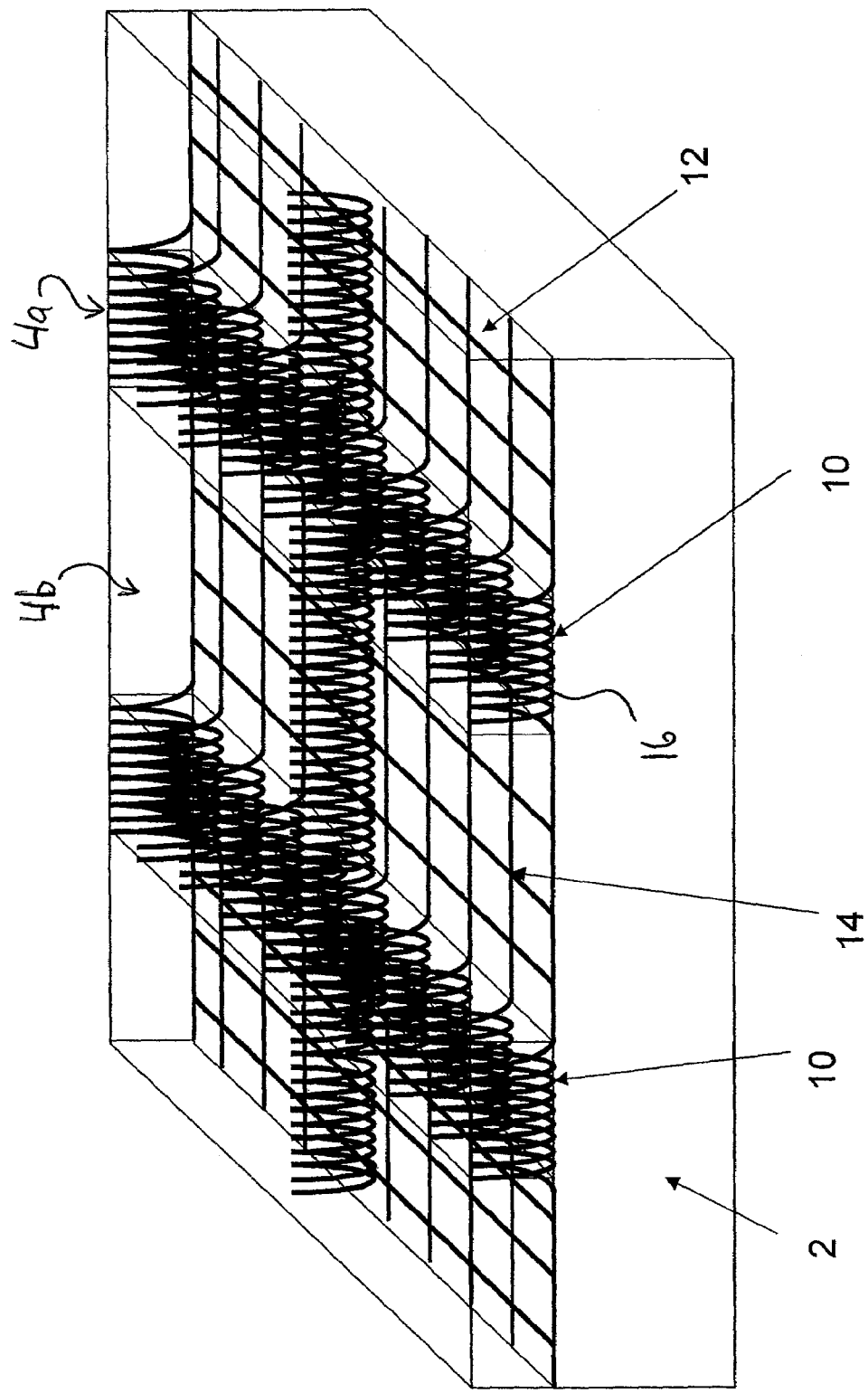
FIG. 9 illustrates a perspective view of the substrate and a relaxed silicon germanium layer. The misfit segments of the dislocations are shown traveling perpendicular to one another.
Figure 10:
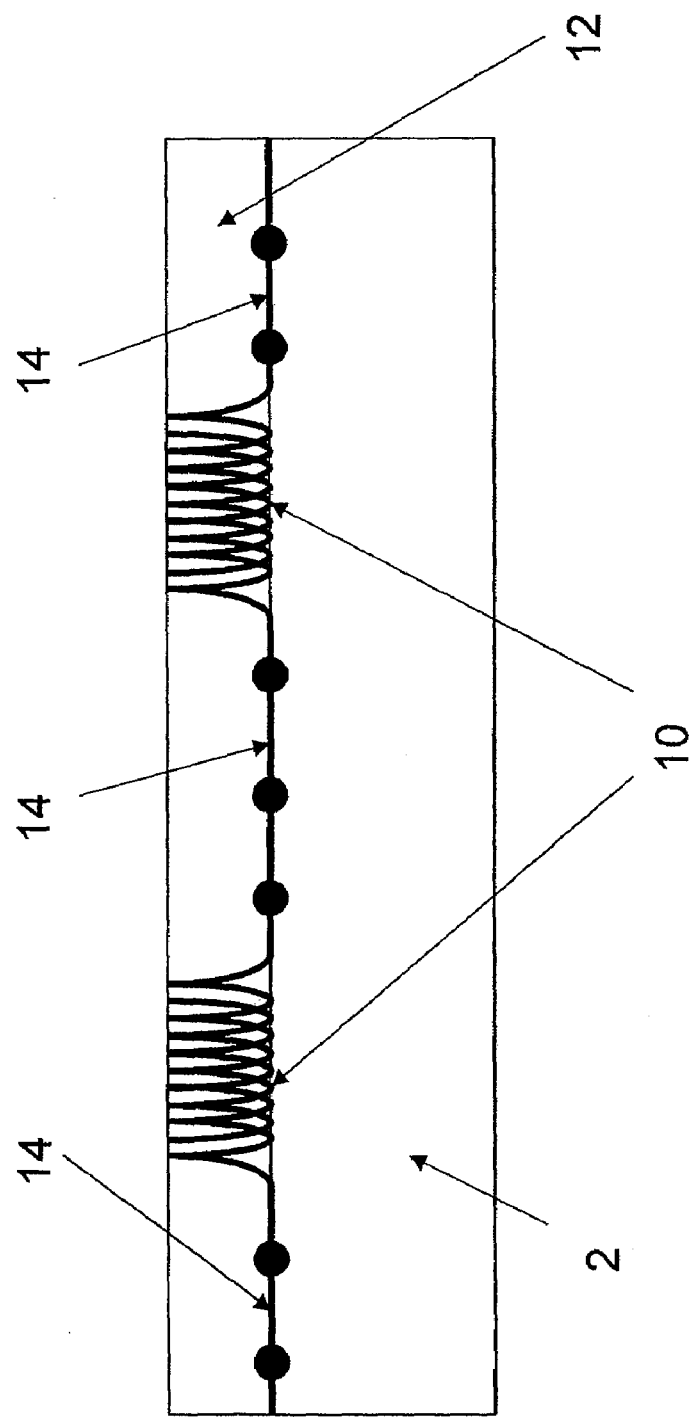
FIG. 10 illustrates a side view of the substrate and relaxed silicon germanium layer shown in FIG. 9.

FIGS. 9 and 10 illustrate a substrate 2 including a relaxed silicon germanium layer 12. The layer 4 of strained silicon germanium and substrate 2 are subject to an annealing process to relax the strain in the layer 4 of silicon germanium to a relaxed silicon germanium layer 12, such as, for example, as illustrated in FIGS. 9 and 10. The annealing process may then "pull out" dislocation loops and propagates misfit dislocation segments 14 from one region, such as region 4a, to another region 4a. The propagation of the misfit dislocation segments 14 may therefore release the strain in the layer 4 of silicon germanium layer such that the threading dislocations 16 remain inside the regions 4a. This may result in few or even nearly no threading dislocations (e.g., threading arms) in the regions 4b.

An annealing process may be performed at temperatures ranging from about 400° C. to about 1000° C., for example, although the claimed subject matter is not limited in scope in this respect. Annealing may proceed at elevated temperatures for a time period, such as, for example, ranging from ten minutes to about two hours. It should be noted, however, that the claimed subject matter is not limited in scope in this respect. The annealing process may include a multi-operation or multi-sequence annealing process where annealing takes place at multiple temperatures and/or annealing times. The annealing process may take place in an environment that is not a significantly oxidizing environment. For example, annealing may take place in an annealing furnace or rapid thermal annealing chamber including a vacuum environment or an inert gas environment (e.g., Argon or Nitrogen).

The substrate 2 and strained silicon germanium layer 4 may be subjected to annealing conditions such that nucleation of dislocations at random surface sites is reduced or even prevented. One way to reduce random surface nucleation is to form a silicon capping layer (not shown) that may be grown on the layer 4 of strained silicon germanium layer prior to the annealing process. The formation of a silicon capping layer may also be done prior to damage formation in the regions 4a.

Figure 11:
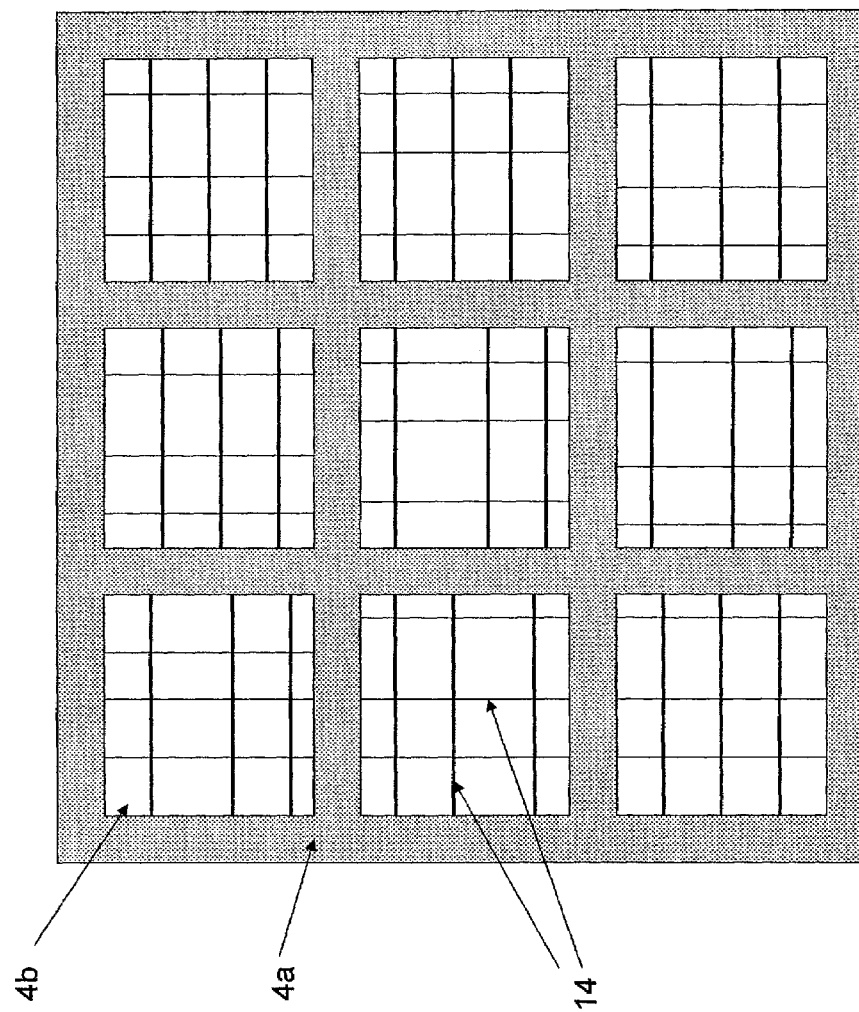
FIG. 11 illustrates a top view of a region of the substrate wherein damaged regions (e.g., lanes) are shown in a substantially perpendicular orientation. The misfit segments of the dislocations are shown traveling in two directions generally perpendicular to one another.

As seen in FIGS. 9 and 10, the misfit dislocation segments 14 propagate in an intersecting pattern generally perpendicular to one another. As shown in FIG. 11, a crossing or intersecting pattern may be formed in which misfit dislocation segments 14 propagate in two generally perpendicular directions. The regions 4b thus contain a network of intersecting misfit dislocation segments 14 but may be substantially free of threading dislocations 16. The intersecting lanes (e.g., crossing pattern) as illustrated in FIG. 11 may be formed in separate processes, simultaneously, or otherwise. For example, in one process, a mask 6 may be used to damage regions 4a in a first direction. The silicon germanium layer 4 is then relaxed (e.g., with an annealing process). A second patterning process may then performed either with the same or different mask 6. The mask 6 may be used to affect or damage regions in a second direction (e.g., substantially perpendicular to the first direction). The silicon germanium layer is then relaxed to form a perpendicular network of misfit dislocation segments 14.

In an alternative process, a perpendicular network of misfit dislocation segments 14 may be created substantially simultaneously. In this process, a one or more masks 6 may be used to damage the silicon germanium layer 4. The substrate 2 and damaged layer 4 of silicon germanium may be subject to an annealing process to relax the silicon germanium in both directions simultaneously. This alternative process may omit an additional processing operation inherent in a sequential process. However, a sequential process may reduce the dislocation interaction.

Figure 12:
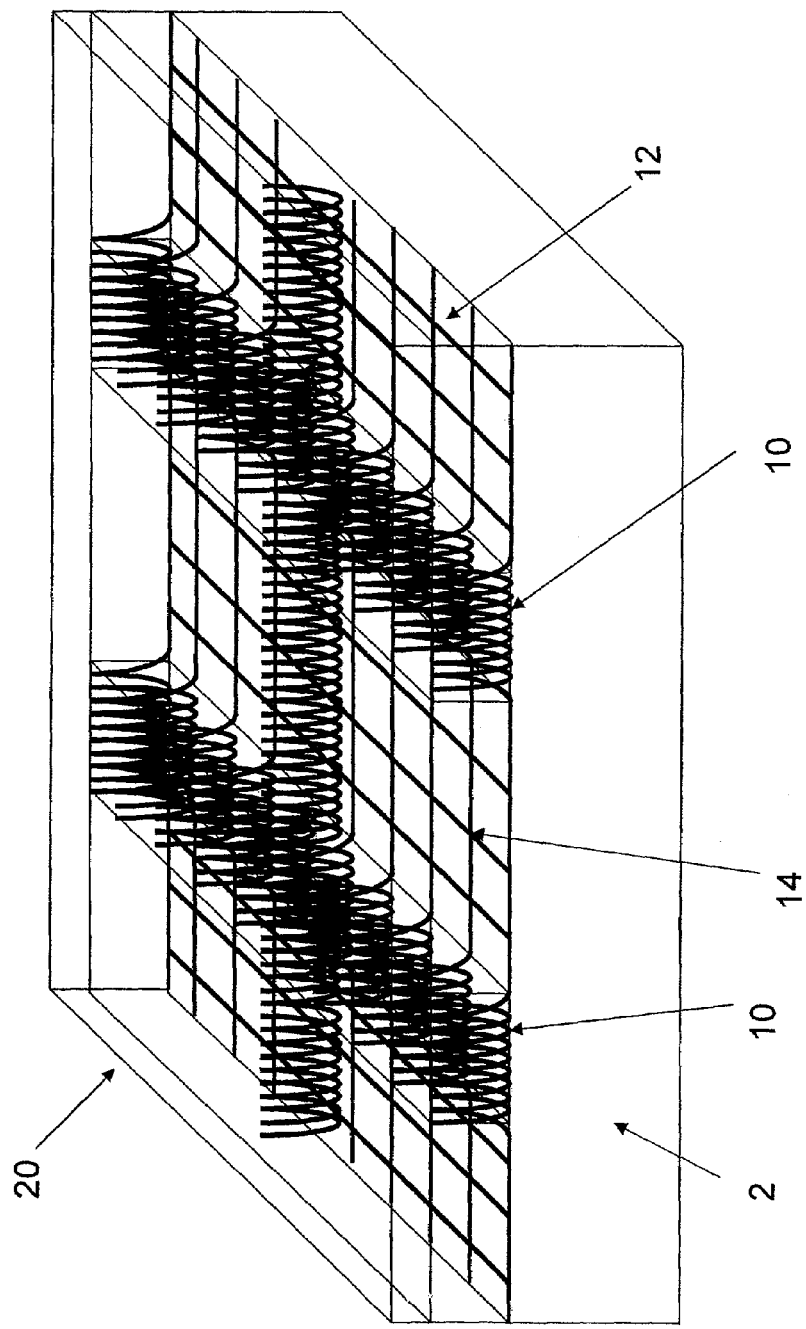
FIG. 12 illustrates a perspective view of substrate having a relaxed layer of silicon germanium disposed thereon. A top layer, for example, comprising strained silicon or silicon germanium is located on top of the relaxed layer of silicon germanium.
Figure 13:
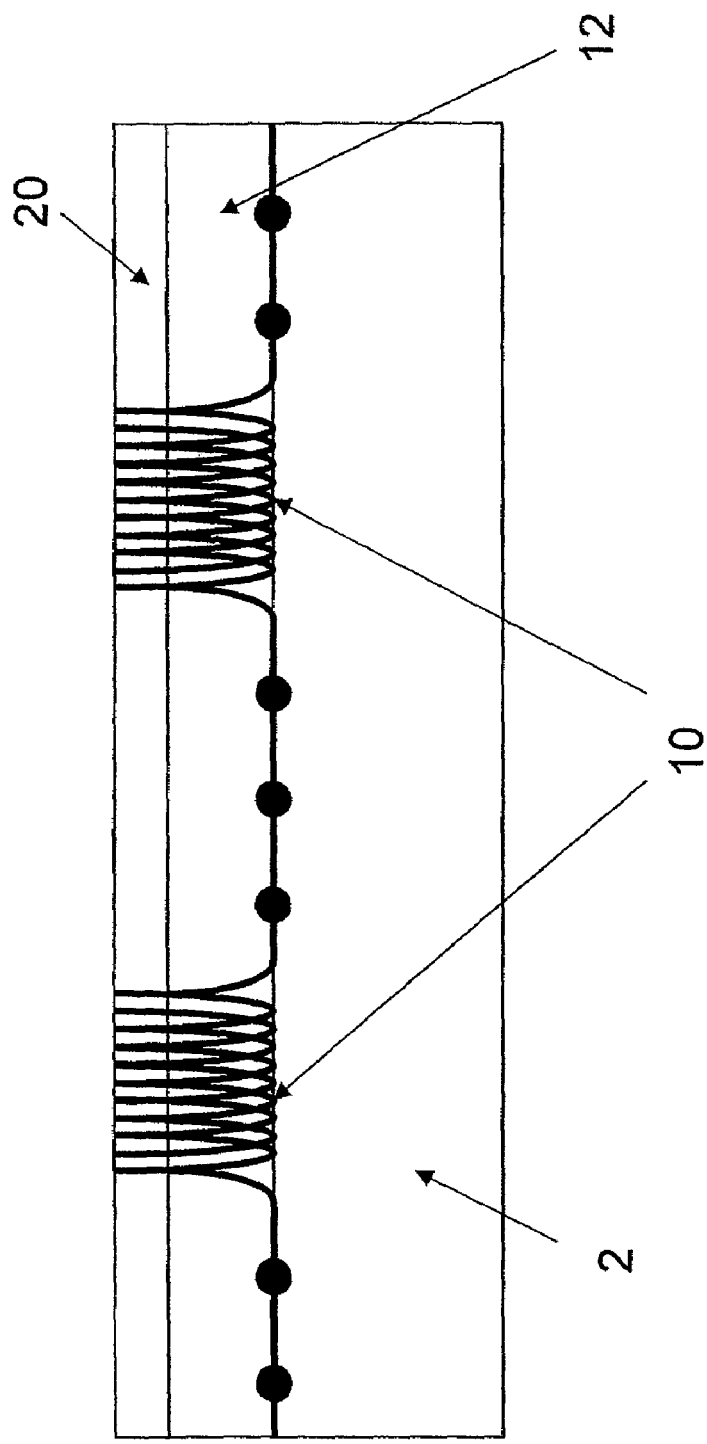
FIG. 13 illustrates a side view of the structure shown in FIG. 12.

FIGS. 12 and 13 illustrate a process of forming a top layer 20 formed on or over top of the relaxed silicon germanium layer 12. The top layer 20 may be formed, for example, from strained silicon or silicon germanium. The top layer 20 may be used to form, for example, a strained silicon channel layer for semiconductor devices such as, for example, transistors. If strained silicon is used in the top layer 20, $Si_xGe_{1-x}$ may be employed that includes about 20% Ge. Conversely, if strained Ge is used (e.g., for PMOSFET applications), $Si_xGe_{1-x}$ may be employed that includes about 70% Ge. It should be understood, however, that the process is not limited to a specific composition of Ge. Rather, the process may be used with $Si_xGe_{1-x}$ where the Ge composition ranges from 0% to 100%.

Figure 14:
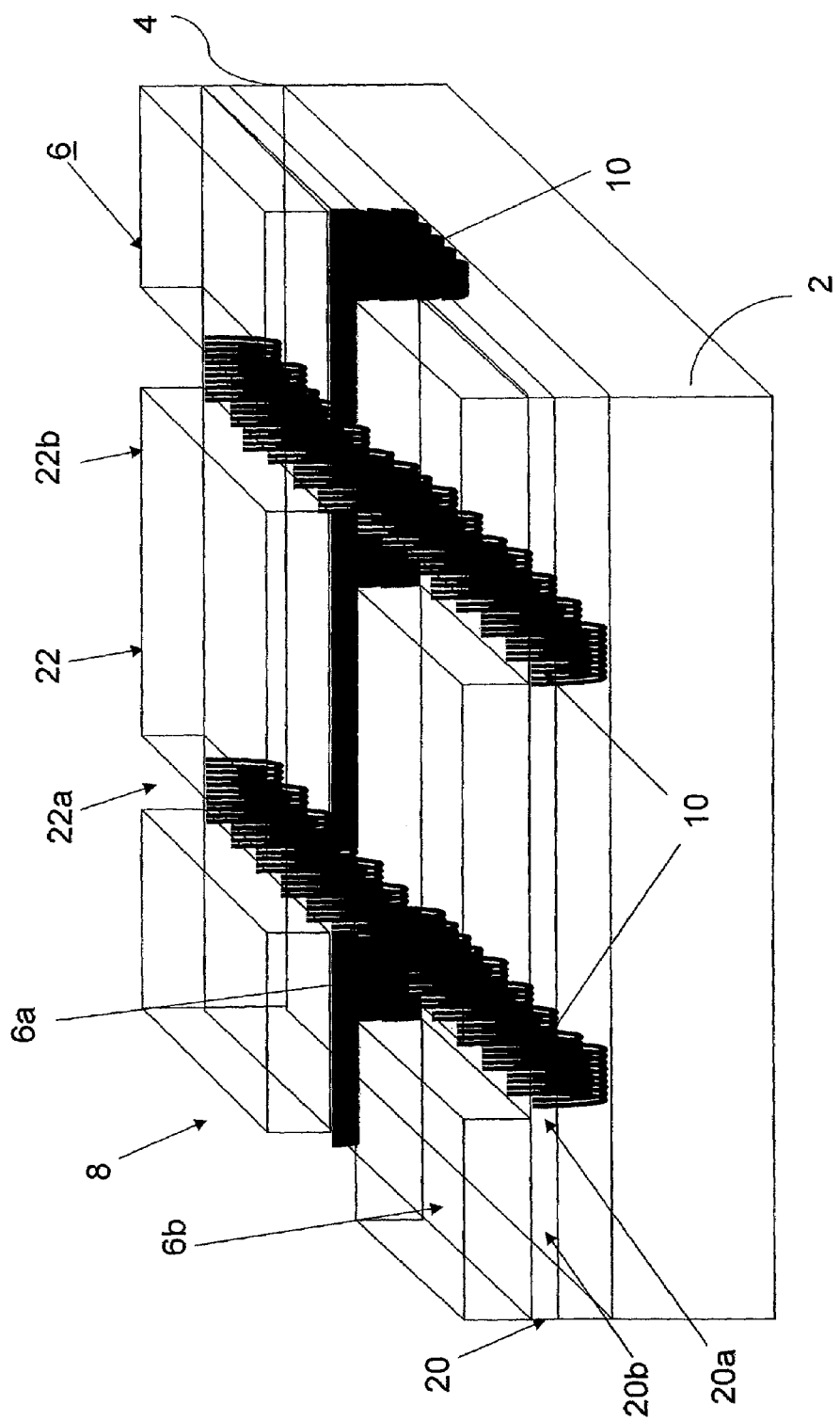
FIG. 14 illustrates a perspective view of a substrate having a relaxed layer of silicon germanium disposed thereon. A top layer, for example, comprising strained silicon or silicon germanium is located on top of the relaxed layer of silicon germanium.
Figure 15:
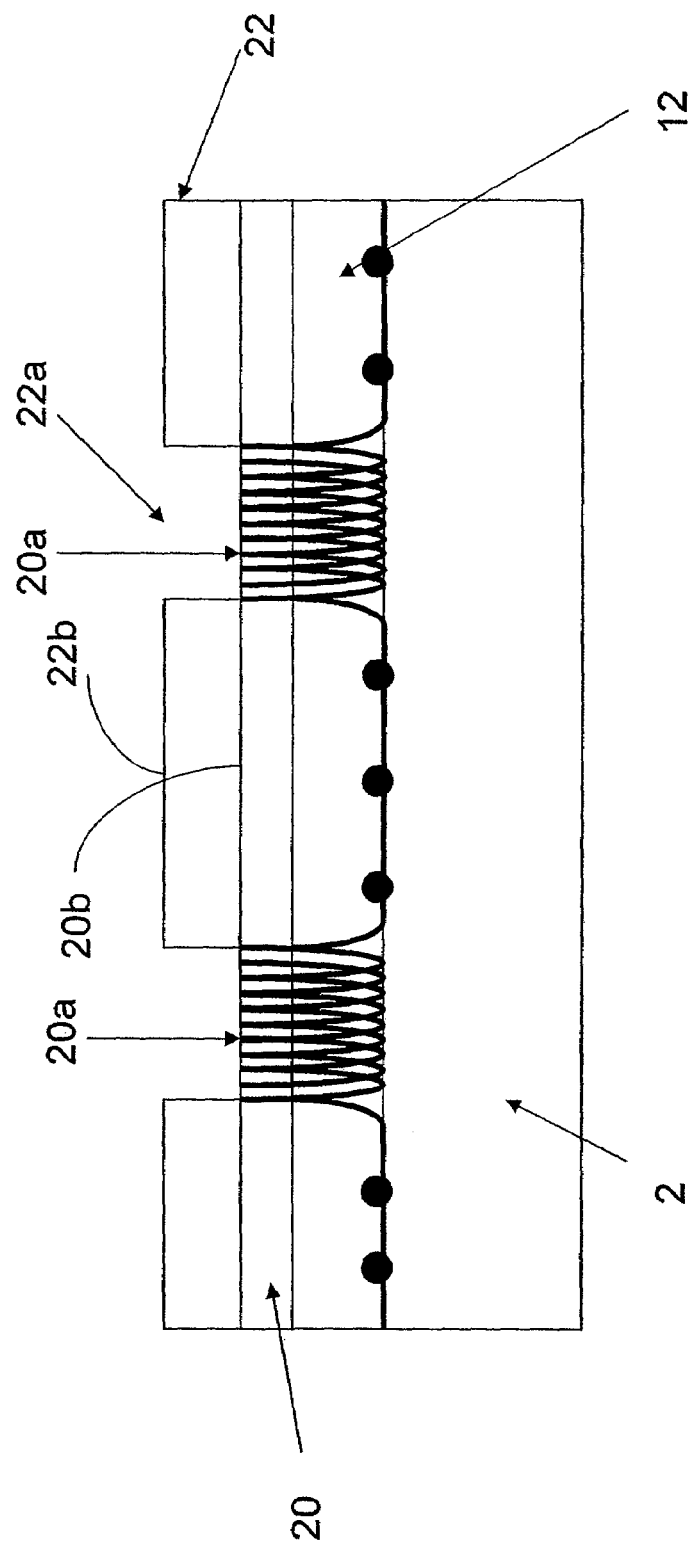
FIG. 15 illustrates a side view of the substrate, relaxed silicon germanium layer, and top layer shown in FIG. 14.

FIGS. 14 and 15 illustrates a mask 22 disposed above the top layer 20. The mask 22 includes an open region 22a and a blocked region 22b. The mask 22 may be the same as or different from the mask 6 described herein. The top layer 20 includes a regions 20a that are exposed via the open regions 22a of the mask 22. Conversely, the blocked region 22b of the mask 22 may be used to form regions 20b (e.g., non-damaged regions) in the top layer 20 as is described below.

Figure 16:
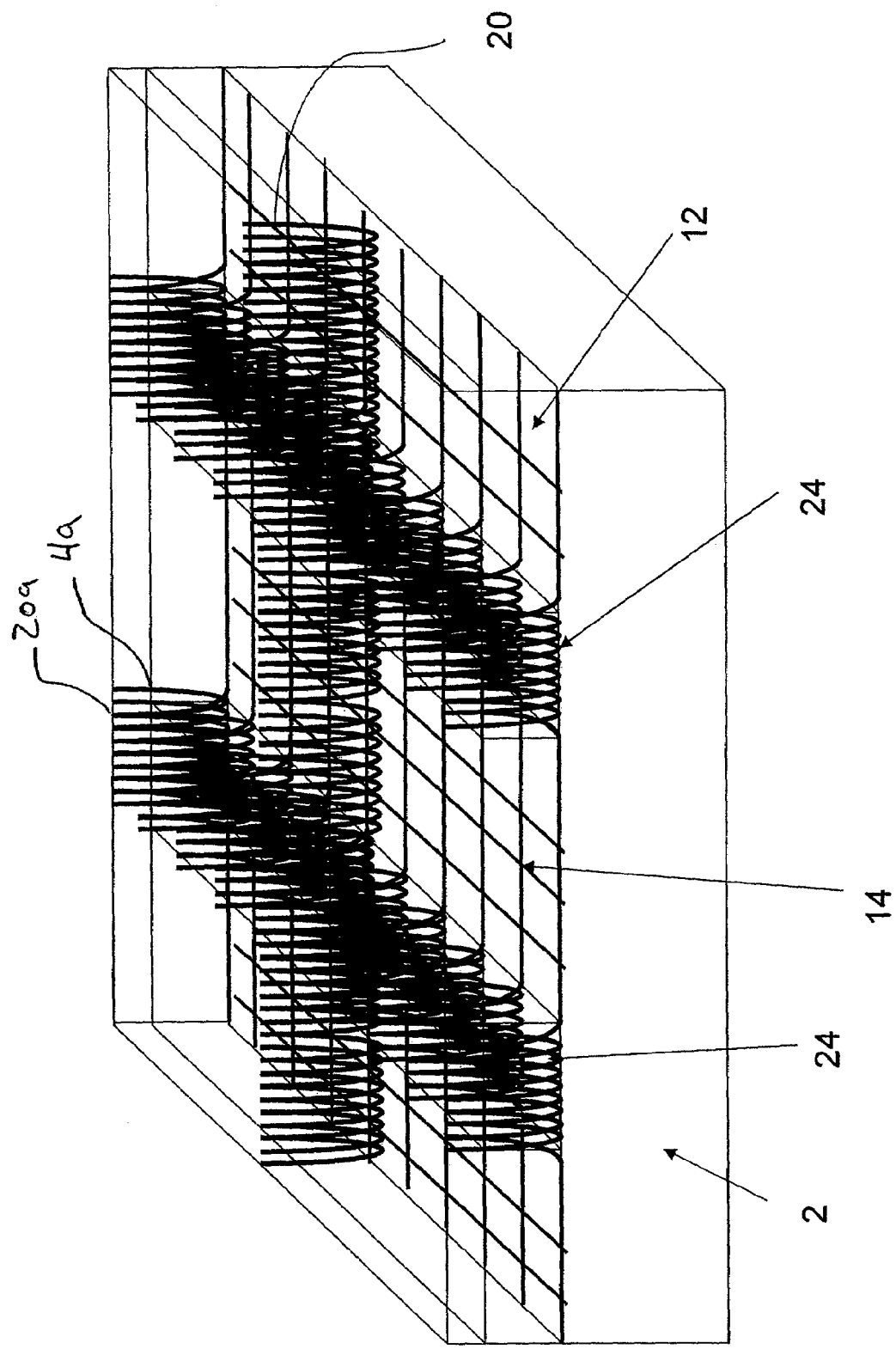
FIG. 16 illustrates the transformation of the damaged one or more regions into silicon dioxide isolation regions.
Figure 17:
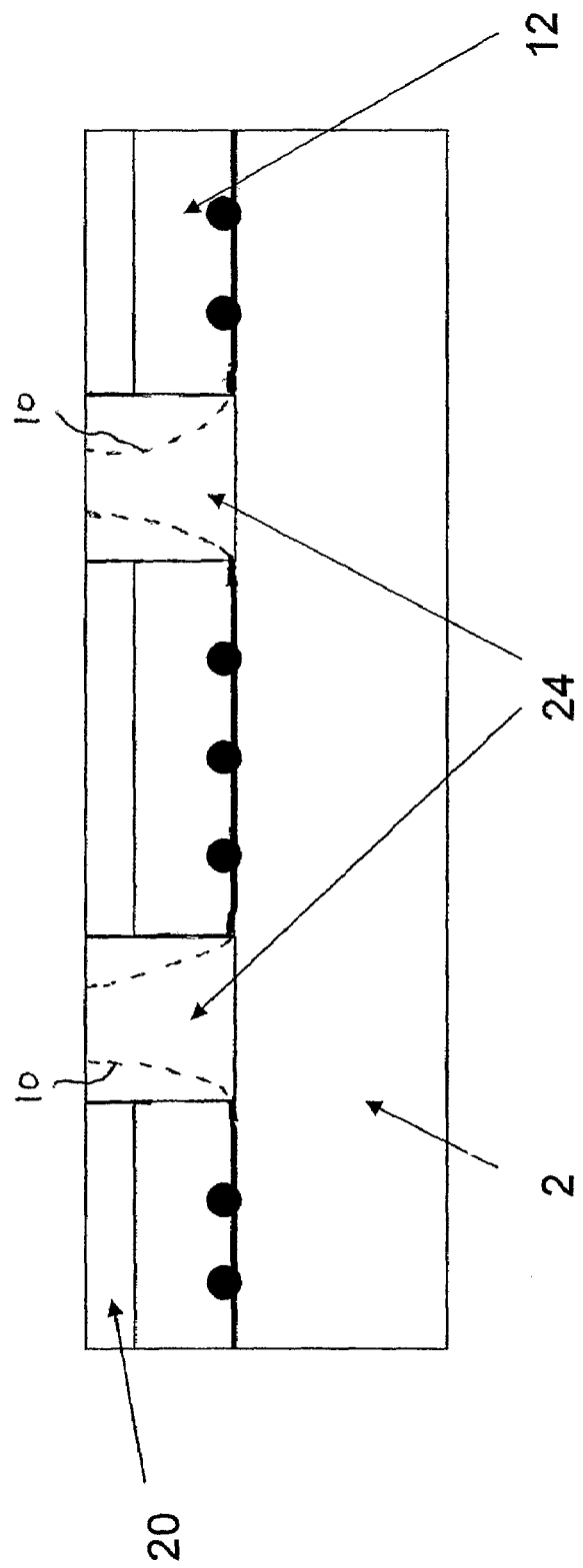
FIG. 17 illustrates a side view of the substrate and associated structures of FIG. 16.
Figure 19:
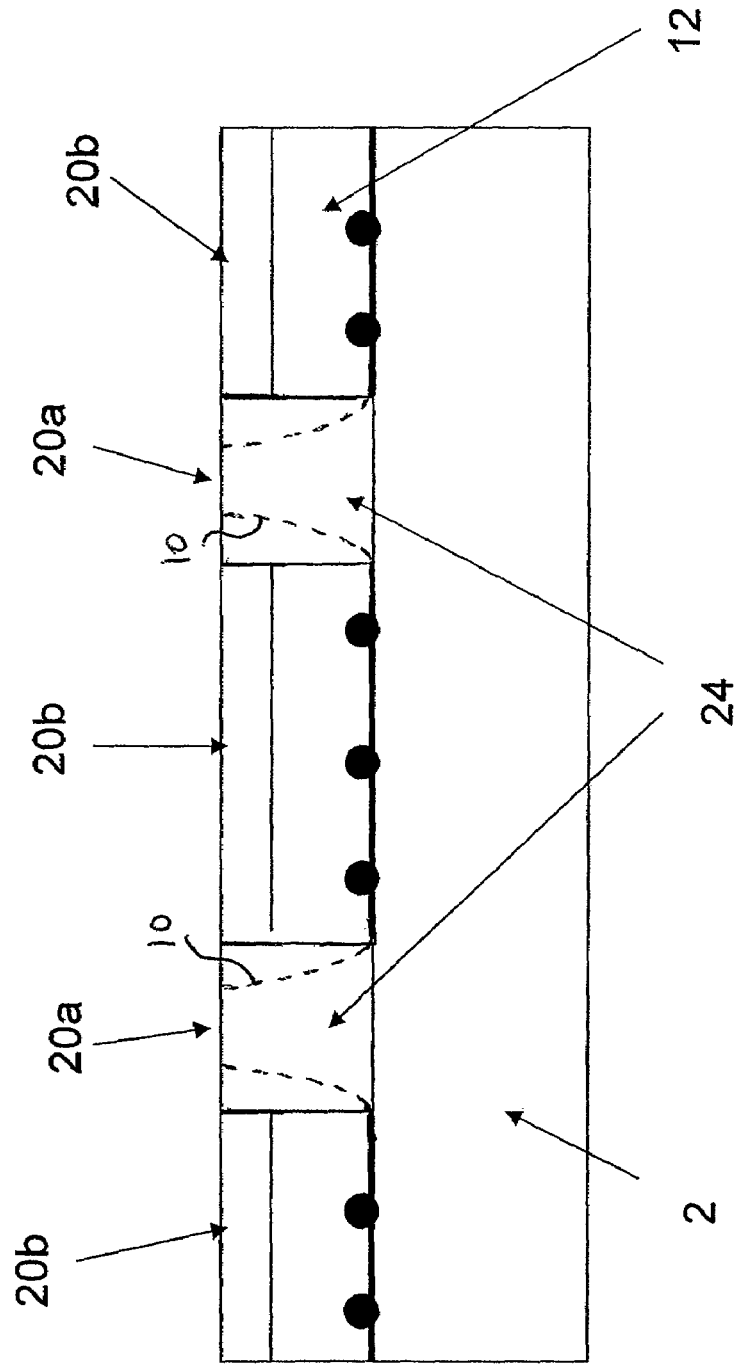
FIG. 19 illustrates a side view of the structure shown in FIG. 18.
Figure 26:
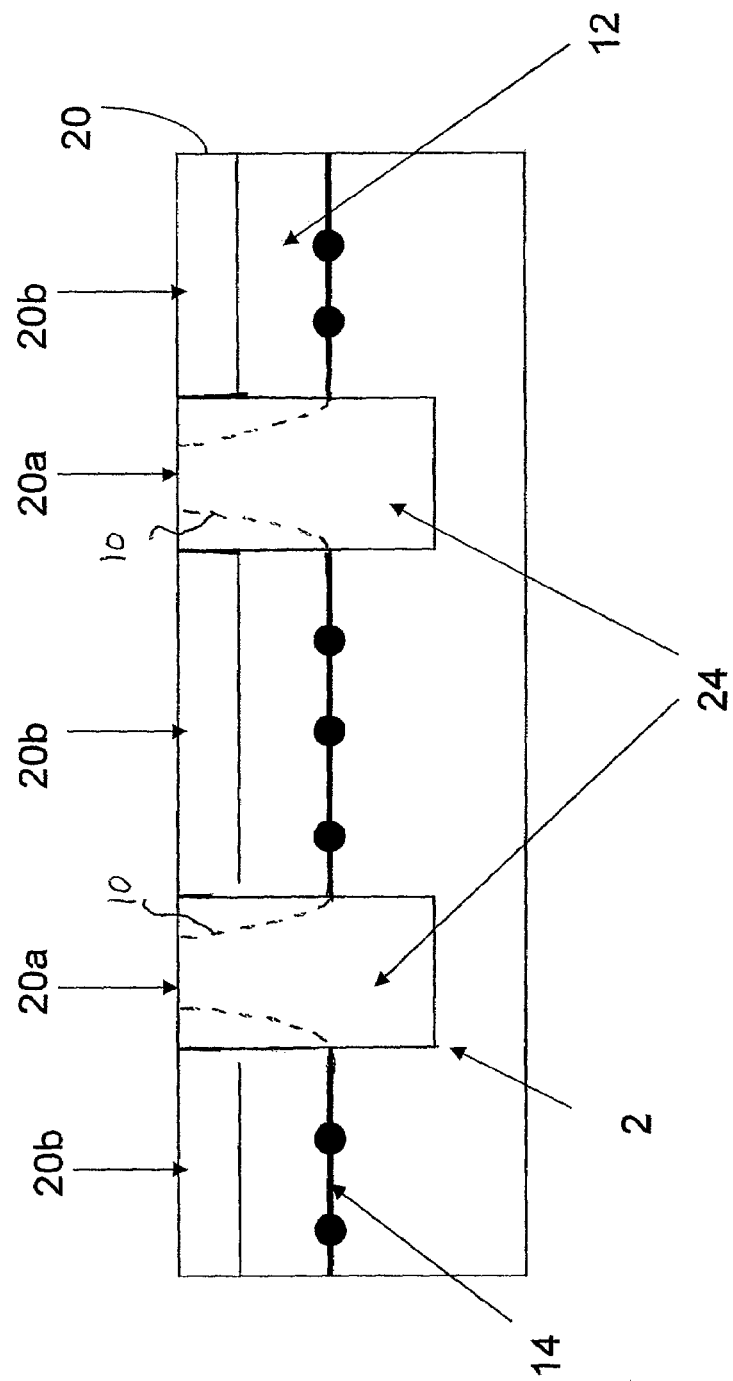
FIG. 26 illustrates a side view of the substrate and associated structures wherein the one or more damaged regions are transformed into silicon dioxide isolation regions. The non-irradiated (non-damaged) top layer regions of strained silicon or silicon germanium are substantially free of threading dislocations.

FIGS. 16 and 17 illustrate the transformation of the regions 4a, 20a into silicon dioxide isolation regions 24. This may be done through several processes including but not limited to trench etching and $SiO_2$ deposition, field oxidation, or oxygen ion implantation and subsequent annealing for $SiO_2$ formation at the regions 4a, 20a. For example, oxide regions 24 may be formed using existing processes for shallow trench isolation. For example, the regions 4a, 20a may be etched by, for example, reactive ion etching followed by filling the etched region with silicon dioxide. This process generally involves forming a pattern with photoresist or a hard mask after depositing an etch-stop layer such as silicon nitride. As best seen in FIGS. 17, 19, and 26, the oxide regions 24 (e.g., etched trenches) may be wider than the dislocations 10 such that the final structure is substantially free of dislocations 10. The patterned surface may be subject to etching by reactive ions to form a square-shaped groove. The photoresist may then be removed and the substrate may be oxidized to form a thin oxide layer. Silicon dioxide may then be deposited to fill the etched regions. The top silicon dioxide layer may then be removed from the top area of the etch stop layer and the etched regions. The etch-stop layer may be removed.

FIG. 17 illustrates the formation of the silicon dioxide isolation regions 24.

Figure 18:
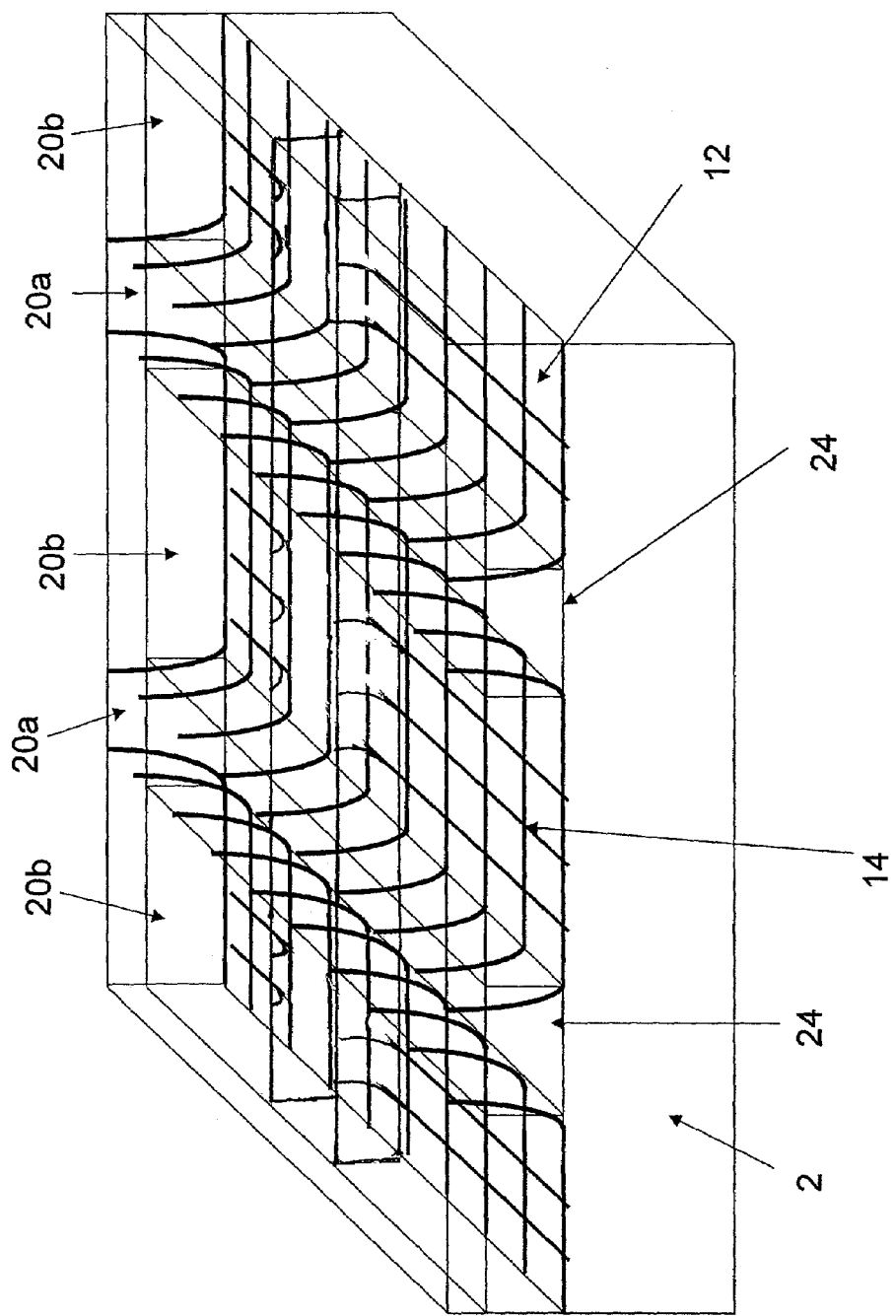
FIG. 18 illustrates a perspective view of substrate wherein the non-irradiated (non-damaged) top layer portion has reduced threading dislocations.

FIGS. 18 and 19 illustrate the substrate 2 with the relaxed silicon germanium layer 12 and top layer 20 interspersed with a plurality of silicon dioxide isolation regions 24. The threading dislocations are included in the silicon dioxide isolation regions 24. The portions 20b of the top layer 20 that are between adjacent silicon dioxide isolation regions 24 are substantially free of threading dislocations. Dislocations in the top layer 20 are isolated with the portions 20a lying just above the silicon dioxide isolation regions 24.

Figure 20:
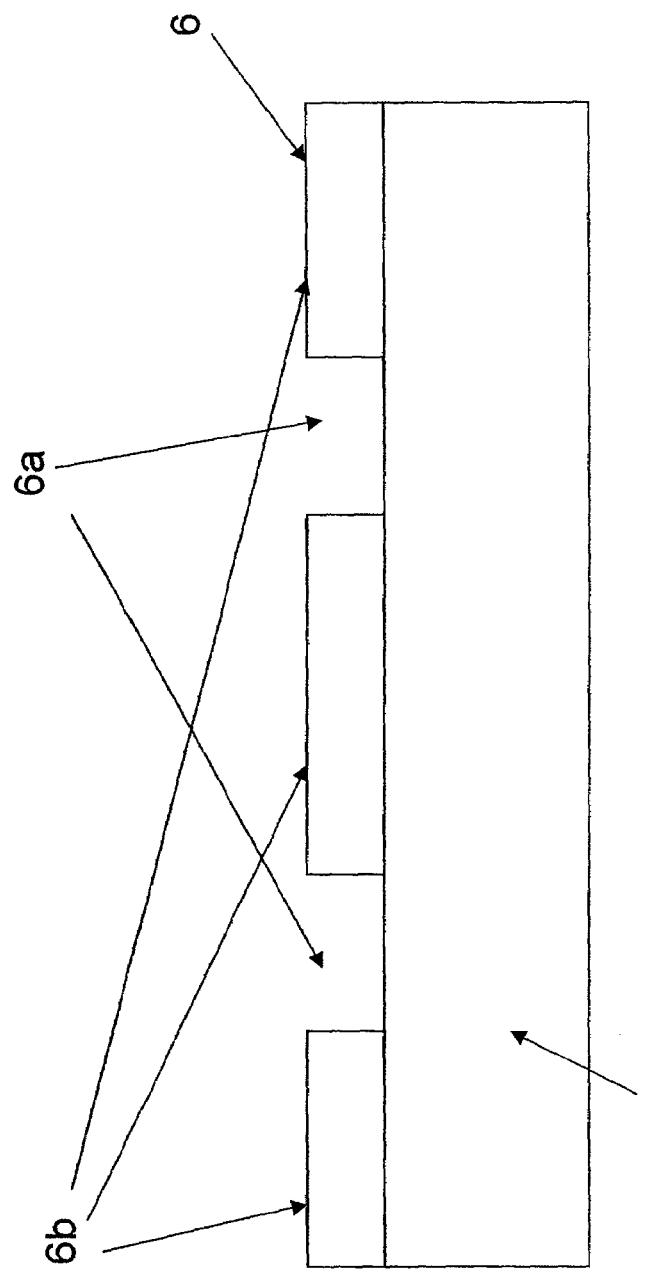
FIG. 20 illustrates a side view of a substrate having a mask disposed above an upper surface thereof.
Figure 21:
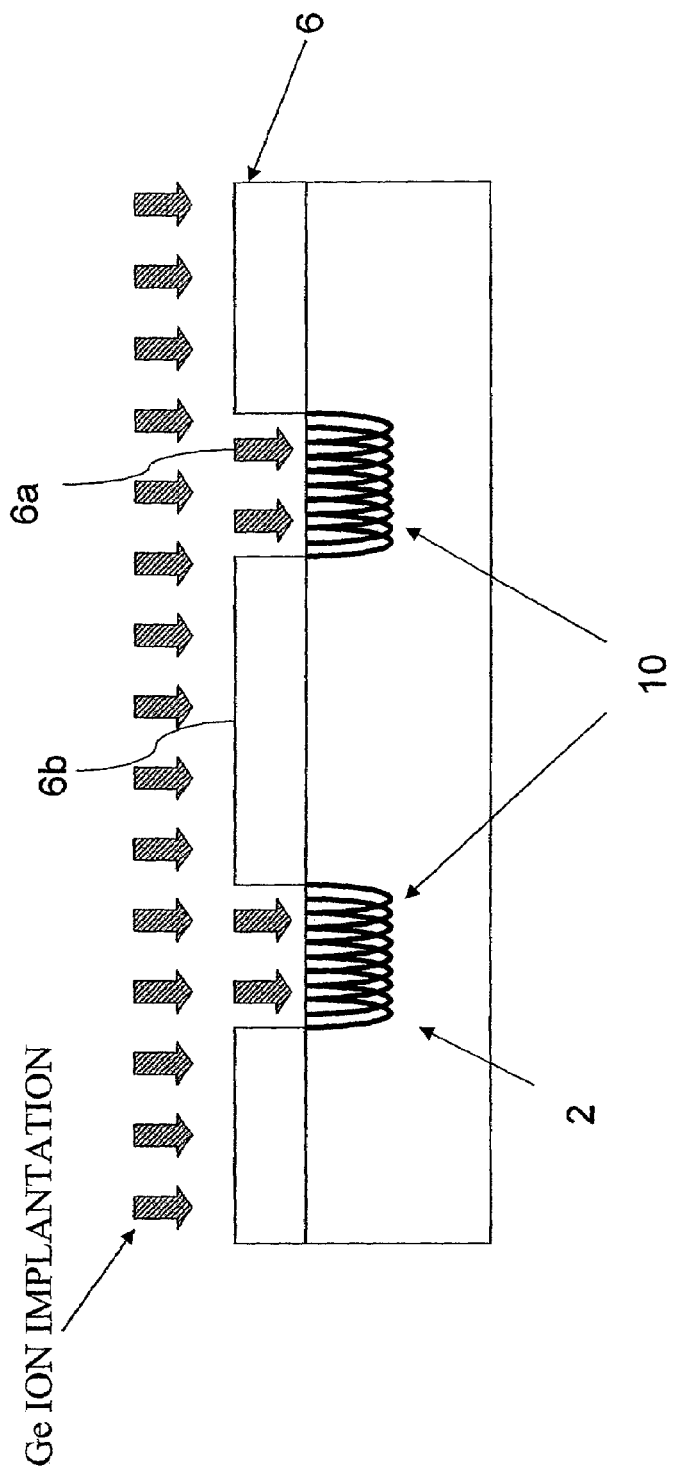
FIG. 21 illustrates a side view of the substrate illustrated in FIG. 20 being irradiated with a dislocation inducing agent (e.g., Ge+ ions). Dislocations are created in the one or more regions of the substrate by use of the mask.

FIGS. 20 and 21 illustrate an alternative process for affecting at least in part, the dislocation position in a buffer layer formed, for example, from silicon germanium. One difference form the process illustrated in FIGS. 1-19 is that the substrate 2 may be damaged prior to growing the strained silicon germanium layer 4.

FIG. 20 illustrates a side view of substrate 2 with a mask 6 disposed on or over an upper surface of the substrate 2. The mask 6 includes a plurality of open regions 6a and blocked regions 6b. As explained below, the open regions 6a of the mask permit the passage of a dislocation inducing agent 8 into regions 2a of the substrate 2. FIG. 21 illustrates a side view of the substrate 2 being irradiated with the dislocation inducing agent 8 (e.g., Ge+ ions). The dislocation inducing agent 8 may include a ion beam, electron beam, or other energetic radiation source capable of forming dislocations in the substrate 2. For example, the dislocation inducing agent 8 may include a Ge+ ion beam (as is shown in FIG. 21). The dislocation inducing agent 8 may result in the formation of dislocations 10 in regions 2a of the substrate (see e.g., FIG. 22). As seen in FIG. 21, each dislocation 10 may include a number of dislocation loops.

Figure 22:
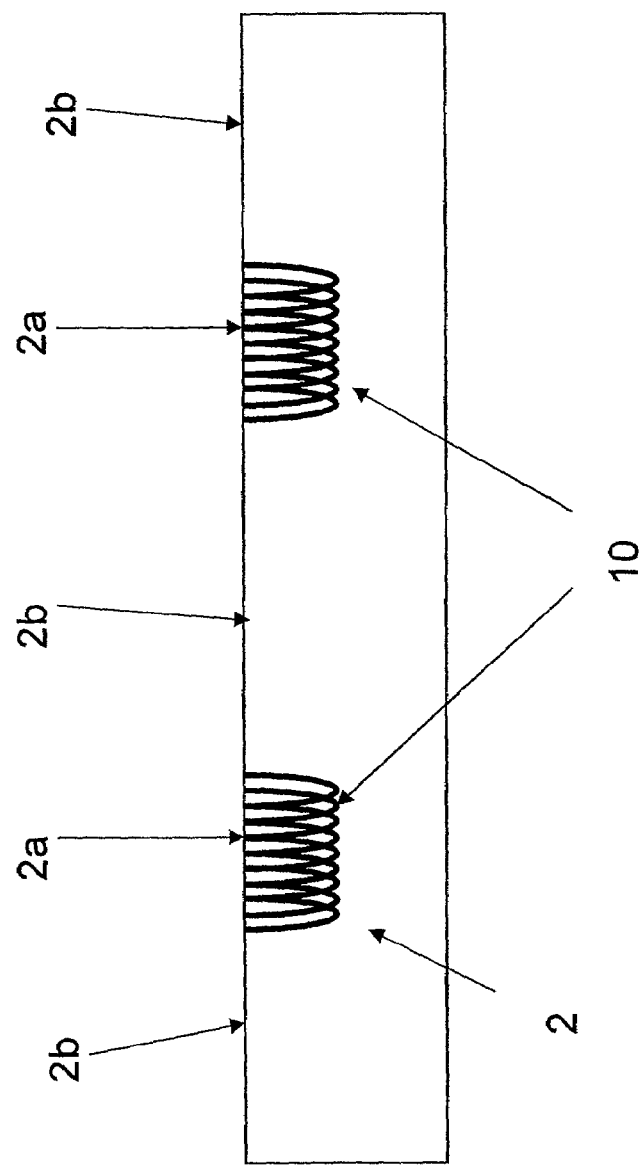
FIG. 22 illustrates a side view of the substrate illustrated in FIG. 21 with the mask removed. The damaged regions are located in one or more regions of the substrate that were exposed to the dislocation inducing agent.
Figure 23:
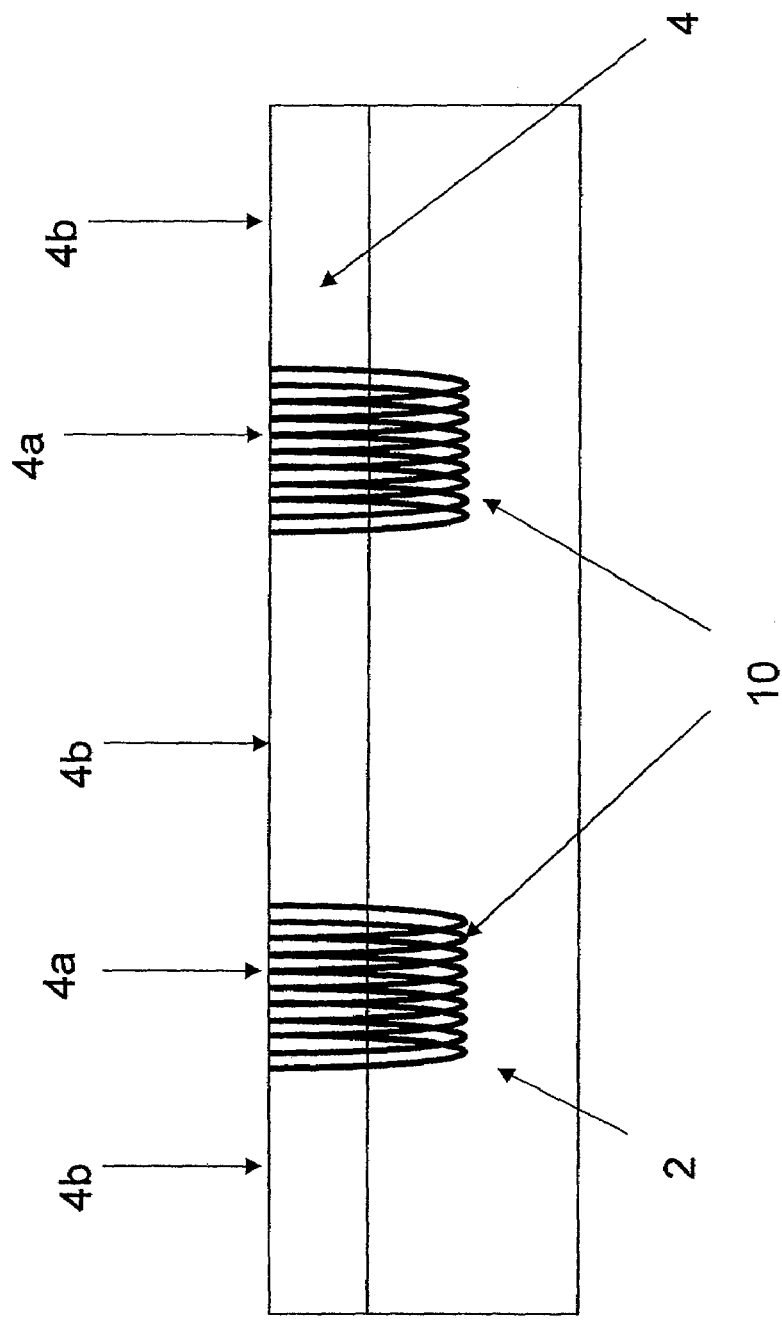
FIG. 23 illustrates a side view the substrate illustrated in FIG. 22 having a strained layer of silicon germanium disposed thereon.

FIG. 22 illustrates the mask 6 removed away from the now-damaged substrate 2. In a next operation, as shown in FIG. 23, a strained layer 4 of silicon germanium may be grown on the substrate 2. The layer 4 of strained silicon germanium may be formed through conventional processes such as, for instance, molecular beam epitaxy and chemical vapor deposition. The dislocations 10 formed in the substrate 2 also appear in the regions 4a of the strained silicon germanium layer 4. The regions 4b of the strained layer 4 of silicon germanium are substantially free from dislocations 10.

Figure 24:
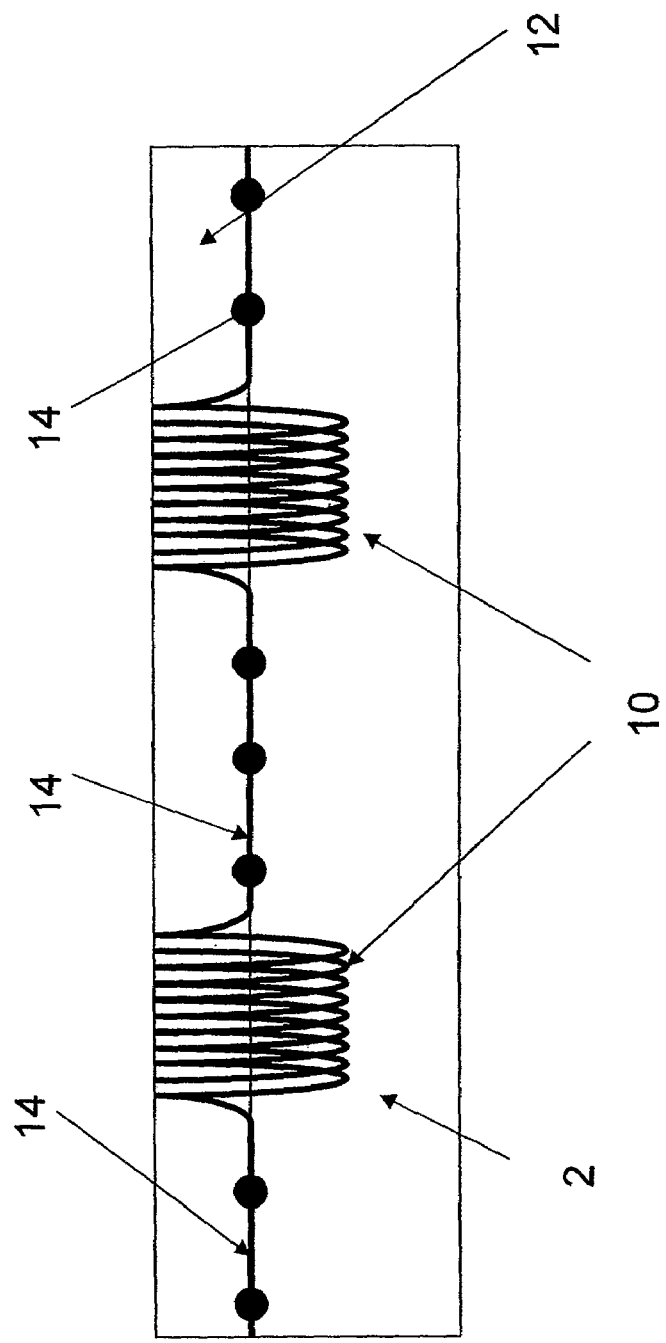
FIG. 24 illustrates a side view of the substrate having a relaxed layer of silicon germanium. The relaxed layer is formed, for example, by subjecting the substrate and strained layer of silicon germanium to a annealing process.

FIG. 24 illustrates the substrate 2 including a relaxed silicon germanium layer 12 after undergoing relaxations by, for example, an annealing process to relax the strain of the silicon germanium layer 4. As best seen in FIG. 24, for example, the annealing operation "pulls out" and propagates misfit dislocation segments 14 the pass from one damaged region to another. A capping layer of silicon (not shown) may be grown on the strained layer 4 of silicon germanium prior to annealing to reduce and/or prevent the nucleation of dislocations in the regions 4b.

As seen in FIG. 24, the misfit dislocation segments 14 may propagate in multiple directions (e.g., generally perpendicular to one another). Consequently, a crossing pattern (such as that shown in FIG. 11) may be formed in which misfit dislocation segments 14 propagate in orthogonal directions, for example. The regions 4b thus include a network of intersecting misfit dislocation segments 14. The intersecting lanes (e.g., crossing pattern) may be formed in separate processes, simultaneously, or otherwise. For example, in one process, a mask 6 may be used to damage regions 2a of the substrate 2 in a first direction. The layer 4 of silicon germanium may be grown and relaxed (e.g., with an annealing process). A second patterning process may be performed either with the same or different mask 6. The mask 6 may be used to damage regions 4a of the layer 4 of silicon germanium in a second direction (e.g., substantially perpendicular to the first direction). The layer 4 of silicon germanium may then be relaxed to form a perpendicular network of misfit dislocation segments 14, for example.

In an alternative process, a perpendicular network of misfit dislocation segments 14 may be created substantially simultaneously. In this process, a one or more masks 6 may be used to damage the substrate 2. The substrate 2 and layer 4 may then be subject to an annealing process to relax the silicon germanium in both directions substantially simultaneously.

Figure 25:
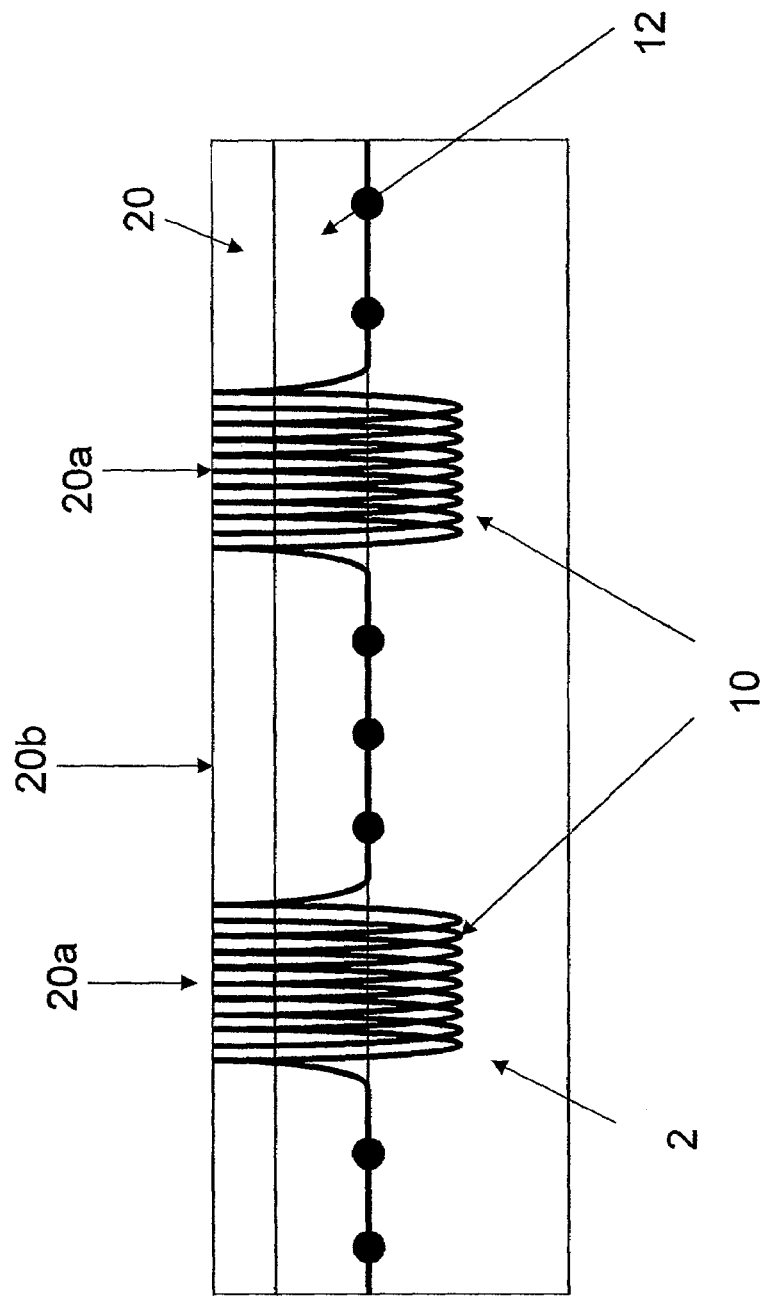
FIG. 25 illustrates a side view of the structure illustrated in FIG. 24 having a top layer deposited thereon. The top layer may be formed, for example, of strained silicon or silicon germanium.

FIG. 25 illustrates a top layer 20 that may be grown on the relaxed silicon germanium layer 12. The top layer 20 may be formed, for example, from strained silicon or silicon germanium. As seen in FIG. 25, the dislocations 10 are concentrated in the regions 20a thereby leaving the regions 20b substantially free of any threading dislocations.

FIG. 26 illustrates the substrate 2 with the relaxed silicon germanium layer 12 and top layer 20 interspersed with a plurality of silicon dioxide isolation regions 24. The threading dislocations are all included in the silicon dioxide isolation regions 24. The regions 20b of the top layer 20 that are between adjacent silicon dioxide isolation regions 24 are substantially free of threading dislocations. The silicon dioxide isolation regions 24 may be formed using one of the methods disclosed herein.

In the processes described above, a strained silicon or silicon germanium layer is able to be fabricated on or over a relaxed silicon germanium buffer layer grown on or over a silicon substrate. Devices may then be fabricated in the regions 20b of the strained silicon or silicon germanium layer. The threading dislocations may be formed or forced into the isolation regions 24. Consequently, there is effective use of the available "real estate" of the substrate 2 for device fabrication. On a surface area basis, the non-damaged portion of the substrate 2 (where device fabrication can occur) may exceed 98%. Thus, substantially the entire surface of the substrate 2 may be formed substantially free of threading dislocations.

FIGS. 27A, 27B, and 27C illustrate a process of forming an array of quantum dots 40 on a substrate 42 (e.g., a silicon substrate 42). A substrate 42 may be provided and a strained silicon germanium layer 44 may be grown or otherwise deposited on or over the substrate 42. Using the methods described herein, regions 44a of the strained silicon germanium layer 44 may be irradiated with a dislocation inducing agent 8 (not shown in FIGS. 27A, 27B, and 27C). The regions 44a may include an array of points (as is shown in FIG. 27) or may include an intersecting network of lanes. As seen in FIG. 27B, the substrate 42 and strained silicon germanium layer 44 may then subject to an annealing process to relax the strain in the silicon germanium layer 44. A layer of relaxed silicon germanium 45 may be formed. A relaxation process forms a dislocation network 46 (e.g., a substantially perpendicular network) that includes misfit dislocation segments 48 that interconnect with the damaged regions 44a shown in FIG. 27A.

As seen in FIG. 27C, a regular array of quantum dots 40 may be grown on the relaxed silicon germanium layer 45. The quantum dots 40 may then be preferentially formed on the dislocation network 46.

While particular embodiments have been shown and described, various modifications may be made without departing from the scope of the claimed subject matter. The claimed subject matter, therefore, should not be limited, except to the following claims, and their equivalents.

What is claimed is:

1. An article of manufacture comprising:
   a substrate;
   a single relaxed buffer layer disposed on the substrate;
   a capping layer disposed over the single relaxed buffer layer; and
   a plurality of isolation regions formed in the single relaxed buffer layer, wherein the isolation regions are formed in a substantially perpendicular intersecting network in the single relaxed buffer layer, wherein the isolation regions comprise threading dislocations, and wherein the remainder of the single relaxed buffer layer is substantially free of threading dislocations.

2. The article of manufacture of claim 1, wherein the single relaxed buffer layer comprises silicon germanium.

3. The article of manufacture of claim 1, wherein the density of threading dislocations in the remainder of the single relaxed buffer layer is substantially the same as the threading dislocation density of the substrate.

4. The article of manufacture of claim 1, wherein the substrate is silicon.

5. The article of manufacture of claim 1, further comprising a plurality of active electronic devices formed in the remainder of the single relaxed buffer layer.

6. The article of manufacture of claim 1, wherein the isolation regions comprise silicon dioxide isolation regions.

7. The article of manufacture of claim 1, wherein the isolation regions comprise trenches.

8. The article of manufacture of claim 1, wherein the fractional area occupied by the plurality of isolation regions is less than 2% of the total area.

9. The article of manufacture of claim 1, wherein the capping layer comprises silicon.

10. The article of manufacture of claim 9, wherein the capping layer forms a strained channel layer for a transistor.

11. The article of manufacture of claim 1, wherein the isolation regions have widths that are larger than a critical radius of dislocation loops formed therein.

12. An article of manufacture comprising:
    a substrate;
    a single relaxed buffer layer disposed on the substrate;
    a capping layer disposed over the single relaxed buffer layer;
    an array of damaged regions formed in the single relaxed buffer layer, wherein the array of damaged regions comprises a plurality of lanes arranged in an intersecting orientation, and wherein the array of damaged regions comprises threading dislocations; and
    an array of non-damaged regions formed in the single relaxed buffer layer, wherein the array of non-damaged regions comprises an intersecting network, and wherein the intersecting network comrprises misfit dislocations and is substantially free of threading dislocations.

13. The article of manufacture of claim 12, further comprising a plurality of quantum dots formed on the array of non-damaged regions.

14. The article of manufacture of claim 12, wherein the single relaxed buffer layer comprises silicon germanium.

15. The article of manufacture of claim 12, wherein the substrate is silicon.

16. An article of manufacture comprising:
   a substrate;
   a single relaxed buffer layer disposed on the substrate;
   a capping layer disposed over the single relaxed buffer layer; and
   an intersecting dislocation network formed in the single relaxed buffer layer comprising misfit dislocation segments that intersect generally perpendicular to one another, wherein the single relaxed buffer layer is substantially free of threading dislocations, and wherein the intersectinci dislocation network is interrupted by a generally perpendicular network of isolation regions, the isolation regions comprising threading dislocations.

17. The article of manufacture of claim 16, wherein the single relaxed buffer layer comprises silicon germanium.

18. The article of manufacture of claim 16, further comprising an array of quantum dots formed on the intersecting dislocation network.

19. The article of manufacture of claim 16, wherein the surface area of the generally perpendicular network of isolation regions comprises less than 2% of the overall surface area of the article of manufacture.

* * * * *